United States Patent
Yamazaki et al.

(10) Patent No.: US 6,261,881 B1
(45) Date of Patent: Jul. 17, 2001

(54) SEMICONDUCTOR DEVICE PROVIDED WITH SEMICONDUCTOR CIRCUIT CONSISTING OF SEMICONDUCTOR ELEMENT AND METHOD OF MANUFACTURING THE SAME

(75) Inventors: Shunpei Yamazaki, Tokyo; Setsuo Nakajima, Kanagawa, both of (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 09/377,657

(22) Filed: Aug. 19, 1999

(30) Foreign Application Priority Data

Aug. 21, 1998 (JP) .................................. 10-236022
Sep. 1, 1998 (JP) .................................. 10-247644

(51) Int. Cl.⁷ .................................. H01L 21/00

(52) U.S. Cl. .................. 438/161; 438/149; 257/69

(58) Field of Search ...................... 438/149, 161, 438/166; 349/125, 138; 257/59, 69, 72

(56) References Cited

U.S. PATENT DOCUMENTS

| | | | |
|---|---|---|---|
| 5,594,569 | 1/1997 | Konuma et al. | 349/122 |
| 5,812,137 | * 10/1998 | Wakai et al. | 438/163 |
| 5,917,564 | * 6/1999 | Kim et al. | 349/46 |
| 6,140,668 | * 10/2000 | Mei et al. | 257/66 |
| 6,144,082 | * 11/2000 | Yamazaki et al. | 257/412 |
| 6,146,927 | * 11/2000 | Yamanaka | 438/149 |
| 6,160,268 | * 12/2000 | Yamazaki | 257/57 |

FOREIGN PATENT DOCUMENTS

| | | |
|---|---|---|
| 58-105574 | 6/1983 | (JP) . |
| 3-038755 | 6/1991 | (JP) . |
| 7-226515 | 8/1995 | (JP) . |

OTHER PUBLICATIONS

English abstract re Japanese Laid–Open application No. 58–105574.

English abstract re Japanese Laid–Open application No. 07–226515.

Inui, S. et al, "Thresholdless Antiferroelectricity in Liquid Crystals and its Application to Displays," *J. Mater. Chem.*, pp. 671–673, 1996.

Yoshida, T. et al, "A Full–Color Thresholdless Antiferroelectric LCD Exhibiting Wide Viewing Angle with Fast Response Time," *SID 97 Digest*, pp. 841–844, 1997.

(List continued on next page.)

*Primary Examiner*—Michael Trinh
*Assistant Examiner*—Jeff Vockrodt
(74) *Attorney, Agent, or Firm*—Cook, Alex, McFarron, Manzo, Cummings & Mehler, Ltd.

(57) ABSTRACT

The present invention provides a semiconductor device and a method of manufacturing the same, the device being provided with a semiconductor circuit consisting of a semiconductor element that is capable of improving characteristics of a TFT and has uniform characteristics, the device and the method being provided by improving the interface between an active layer, in particular, a region for constructing a channel formation region and an insulating film. To attain the object above, according to the present invention, a gate wiring (102) is formed on a substrate (100) or a base film (101), a gate insulating film (103), an initial semiconductor film (104) and an insulating film (105) are formed and layered without exposing them to the air, the initial semiconductor film is then crystallized by irradiation with infrared light or ultraviolet light (laser light) through the insulating film (105), an active layer and a protective film having a desired shape are obtained by patterning, and a resist mask is used to complete manufacture of a semiconductor device provided with an LDD structure.

51 Claims, 16 Drawing Sheets-

OTHER PUBLICATIONS

Furue, H. et al, "Characteristics and Driving Scheme of Polymer–Stabilized Monostable FLCD Exhibiting Fast Response Time and High Contrast Ratio with Gray–Scale Capability," *SID 98*, P–78, 1998.

U.S. patent application No. 09/363,954 (pending) to Yamazaki et al., filed Jul. 29, 1999, including specification, claims, abstract and drawings.

U.S. patent application No. 09/384,647 (pending) to Yamazaki, filed Aug. 27, 1999, including specification, claims, abstract, drawings and PTO filing receipt.

* cited by examiner

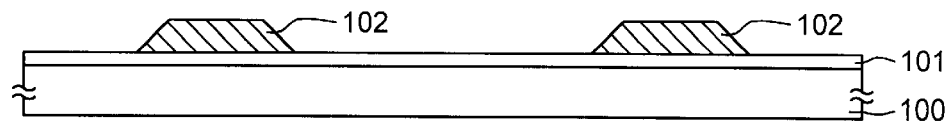
FIG.1A
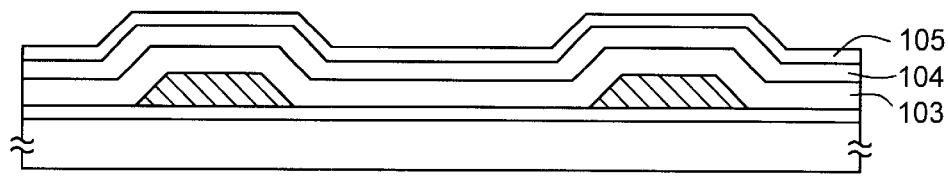
FIG.1B
FIG.1C
LASER CRYSTALLIZATION PROCESS
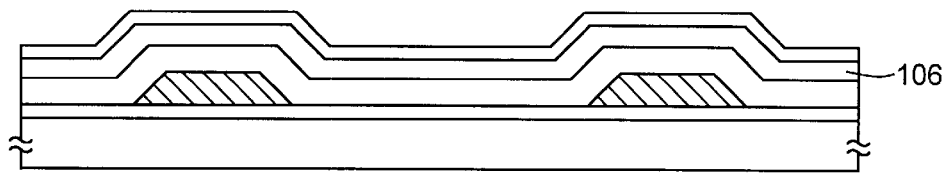
FIG.1D
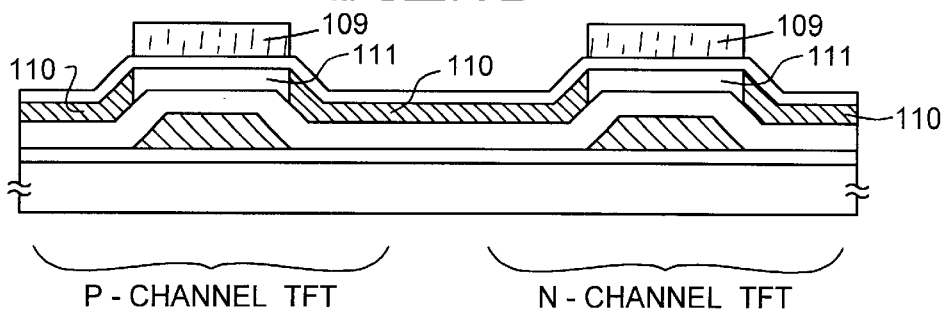
P - CHANNEL TFT    N - CHANNEL TFT

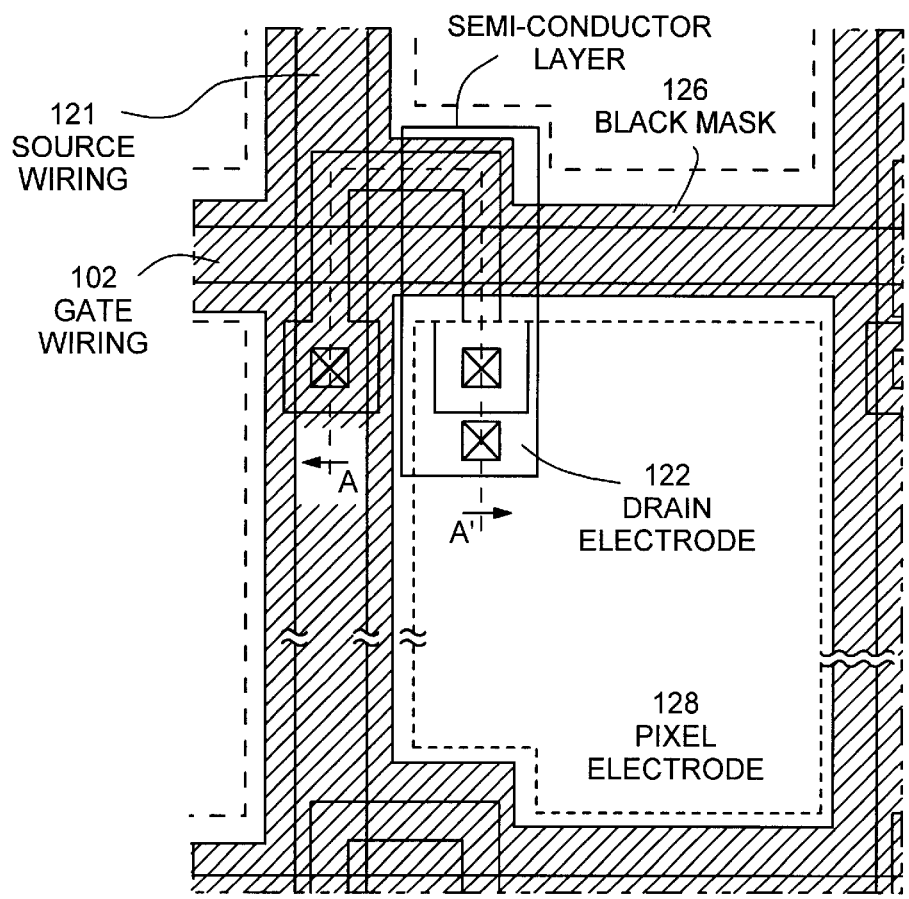
FIG.4A
FIG.4B
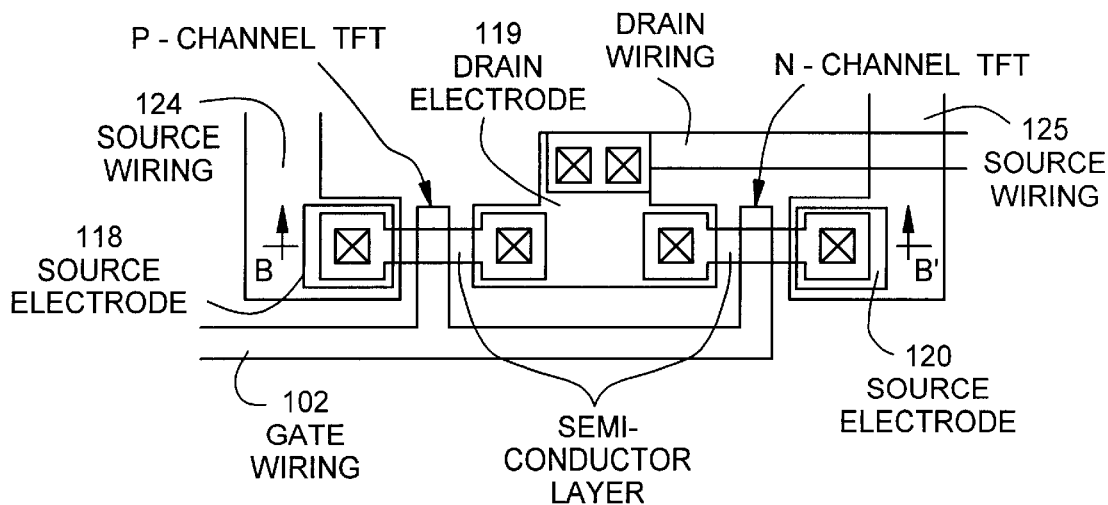

P - CHANNEL TFT   N - CHANNEL TFT

SEMICONDUCTOR DEVICE PROVIDED WITH SEMICONDUCTOR CIRCUIT CONSISTING OF SEMICONDUCTOR ELEMENT AND METHOD OF MANUFACTURING THE SAME

BACKGROUND OF THE INVENTION

1. Field of the Invention

The present invention relates to a structure of a semiconductor device provided with a semiconductor circuit consisting of a semiconductor element such as an insulated-gate type transistor, and to a method of manufacturing the same. In particular, the present invention relates to a structure of a semiconductor device provided with a semiconductor circuit consisting of a semiconductor element having the LDD structure formed with the use of a resist, and a method of manufacturing the same. A semiconductor device according to the present invention includes not only an element such as a thin film transistor (TFT) or a MOS transistor but also an electro-optical device such as a display device or an image sensor which has a semiconductor circuit consisting of the insulated-gate type transistor. In addition, a semiconductor device of the present invention also includes an electronic equipment provided with those electro-optical devices.

2. Description of the Related Art

What have attracted attention is an active matrix type liquid crystal display device in which a pixel matrix circuit and a driver circuit consist of a thin film transistor formed on an insulating substrate. A liquid crystal display of about 0.5 to 20 inches in size is utilized as a display device.

A TFT having as an active layer a crystalline semiconductor film, typical example of which is a polysilicon film, at present receives attention in an attempt to realize a liquid crystal display capable of displaying with high definition. However, the TFT having as the active layer the crystalline semiconductor film is, on one hand, higher in the operation speed and driving performance as compared with a TFT having as an active layer an amorphous semiconductor film, but, on the other hand, has a problem of significant fluctuation in characteristics between one TFT and another.

As one of the factors in this fluctuation in TFT characteristics, the interface between the active layer and the gate insulating film may be named. When contaminated, this interface affects the TFT characteristics. It is therefore important to purify the interface between an active layer and an insulating film that is in contact with the active layer.

Sought in a TFT now is high mobility, and the potential for use as an active layer of a TFT is a crystalline silicon film that has higher mobility than an amorphous silicon film. An outline of a conventional method of manufacturing a TFT will be described below in a simplified manner.

First, a gate wiring is formed on an insulating substrate, and a gate insulating film and an amorphous silicon film are layered thereon to form a polysilicon film by applying on this amorphous silicon film a crystallizing process such as heating or laser light irradiation. Subsequently, this polysilicon film is patterned into a desired shape to form an active layer. The polysilicon film is then selectively added with impurities that give P type or N type conductivity to form an impurity region to be a source region or a drain region. An interlayer insulating film is subsequently formed by deposition, a contact hole is formed to expose the source region or the drain region and, thereafter, a metal film is formed and patterned to form a metal wiring that is brought into contact with the source region or the drain region. The manufacturing process of a TFT is thus completed.

As is described, conventionally, an amorphous semiconductor film is exposed to the air because an insulating film is not formed until several steps (a crystallizing step and a patterning step, for example) are applied after formation of the amorphous semiconductor film.

The air within a clean room, in particular, contains mainly boron escaped from an HEPA filter that is commonly used for purifying, and boron is mixed in the active layer in an uncertain amount when the active layer is exposed to the air. In a conventional case where the active layer is fabricated being exposed to the air, the SIMS analyzation shows that the concentration of boron peaks (the concentration peak is shown by the dotted line B in FIG. 15) at the interface (on the main front surface side or on the back surface side) of the active layer of a TFT, and its maximum value reaches $1 \times 10^{18}$ atoms/cm$^3$ or more. When boron is mixed in the active layer as above, the concentration of impurities in the active layer is difficult to control and the mixed boron causes the threshold of the TFT to vary. To manufacture the layer with the use of other filter costs, and hence is not a proper solution for the problem.

As described above, conventionally, a semiconductor film is formed only to expose its surface to the air, thereby contaminating itself, i.e. the semiconductor layer to be an active layer, with impurities in the air (boron, oxygen, moisture, sodium, etc.). Otherwise, a gate insulating film is formed and then contaminated from the exposure to the air and, in turn, it contaminates with impurities in the air (boron, oxygen, moisture, sodium, etc.) a semiconductor film that is formed to be an active layer on the gate insulating film. When a semiconductor element, for example, a TFT is manufactured using thus contaminated semiconductor film, characteristics of the interface between the active layer, in particular, a channel formation region and the gate insulating film are degraded, causing fluctuation and degradation in electrical characteristics of the TFT. Also, the impurities (boron, oxygen, moisture, sodium, etc.,) inhibit crystallization of the semiconductor film at the crystallization step.

SUMMARY OF THE INVENTION

An object of the present invention is to provide a semiconductor device and a method of manufacturing the same, the device being provided with a semiconductor circuit consisting of a semiconductor element that is capable of improving characteristics of a TFT and has uniform characteristics, the device and the method being provided by improving the interface between an active layer, in particular, a region for constructing a channel formation region and an insulating film.

The structure of a thin film transistor in which an LDD region is provided is conventionally known. An example of the thin film transistor provided with the LDD region is disclosed in Japanese Patent Application Examined No. Hei 3-38755 and in Japanese Patent Application Laid-open No. Hei 7-226515. The LDD region serves to temper the strength of the electric field formed between a channel formation region and a drain region to prevent decrease in OFF current in and degradation of the transistor. However, a manufacturing method of the LDD structure using a conventional technique is complicated and requires many steps.

The present invention further has an object to provide a semiconductor device provided with a semiconductor circuit consisting of a semiconductor element that includes an LDD structure with high productivity, which is high in reproducibility and capable of improving stability of transistor characteristics, and to provide a method of manufacturing the semiconductor device.

To attain the above objects, the present invention is given one feature, among other features, that a gate insulating film and a semiconductor film are formed without exposing them to the air on a substrate having a gate wiring formed thereon, the semiconductor film is then crystallized by irradiation through a protective film with infrared light or ultraviolet light (laser light) and, thereafter, impurities are doped through the protective film to form a source region and a drain region. This impurity doping is made on the semiconductor film through an insulating film (the protective film) covering thereof. It is preferable to sequentially form the gate insulating film, the semiconductor film and the protective film on the substrate having the gate wiring formed thereon without exposing them to the air. The protective film may be formed by irradiating the semiconductor film with laser light.

The present invention adopts the construction in which upon formation of a TFT having the bottom gate structure (typically, the reversed stagger structure), a part of an active layer, at least a channel formation region thereof avoids exposure to the air by the use of the single same chamber, or with employment of a multi-chamber apparatus (examples of which are shown in FIGS. 13 and 14). Such construction may prevent contamination of the active layer interface and realize stable and good electrical characteristics.

According to a first structure of the present invention disclosed in this specification, there is provided a semiconductor device provided with a semiconductor circuit consisting of a semiconductor element comprising:

a gate wiring on a substrate;

a gate insulating film that is in contact with the gate wiring;

an active layer that is in contact with the upper surface of the gate insulating film; and a protective film that is in contact with the upper surface of the active layer, characterized in that the protective film covers at least a part of a source region, a drain region and a channel formation region formed between the source region and the drain region, which constitute the active layer.

In the above structure of the present invention, the element is characterized in that an end face of the active layer is flush with an end face of the protective film.

In the above structure of the present invention, the element is characterized in that the active layer and the protective film are patterned to have the same shape.

In the above structure of the present invention, the element is characterized in that the active layer is a crystalline semiconductor film that is formed through formation steps including at least a step of irradiating an initial semiconductor film with infrared light or ultraviolet light.

In the above structure of the present invention, the element is characterized in that the active layer is a crystalline semiconductor film that is formed through formation steps including at least a step of crystallizing an initial semiconductor film by irradiating the film through the protective film with infrared light or ultraviolet light.

In the above structure of the present invention, the element is characterized in that the gate insulating film, the initial semiconductor film and the protective film are formed through formation steps including at least a step of sequentially forming and layering each film without exposing them to the air.

In the step of forming and layering the films above, the element is characterized in that the gate insulating film, the initial semiconductor film and the protective film are formed respectively using chambers different from one another.

In the step of forming and layering the films above, the element is characterized in that the gate insulating film and the protective film are formed using a first chamber, and the initial semiconductor film is formed using a second chamber.

In the above structure of the present invention, the element is characterized in that the concentration of boron is $3 \times 10^{17}$ atoms/cm$^3$ or less in the interface between the gate insulating film and the channel formation region, or in the interface between the protective film and the channel formation region.

In the above structure of the present invention, the element is characterized in that the concentration of oxygen is $2 \times 10^{19}$ atoms/cm$^3$ or less in the interface between the gate insulating film and the channel formation region, or in the interface between the protective film and the channel formation region.

In the above structure of the present invention, the element is characterized in that the concentration of carbon or nitrogen is $5 \times 10^{18}$ atoms/cm$^3$ or less in the interface between the gate insulating film and the channel formation region, or in the interface between the protective film and the channel formation region.

In the above structure of the present invention, the element is characterized in that the gate wiring has a single-layer structure or a lamination structure, and is made of a material containing as its main ingredient one element or plural kinds of elements forming a compound, the element or elements being selected from a group consisting of aluminum, tantalum, molybdenum, titanium, chromium and silicon.

In the above structure of the present invention, the element is characterized in that the protective film has a film thickness of 5 to 50 nm.

In this specification, the term "initial semiconductor film" is a generical name for semiconductor films, and denotes typically a semiconductor film having an amorphous portion, e.g., an amorphous semiconductor film (such as an amorphous silicon film), an amorphous semiconductor film having microcrystal and a microcrystalline semiconductor film. Those semiconductor films are made of Si films, Ge films or compound semiconductor films [for example, amorphous silicon germanium films expressed as $Si_xGe_{1-x}$ (0<X<1)]. The initial semiconductor film may be formed by a known method such as the low pressure CVD, the thermal CVD and the PCVD.

In this specification, the term "crystalline semiconductor film" denotes a single crystal semiconductor film and a semiconductor film containing a crystal grain boundary (which includes a polycrystalline semiconductor film and a microcrystalline semiconductor film), and is used to clearly distinguish those films from a semiconductor film that is amorphous all over its area (an amorphous semiconductor film). Needless to say, what mentioned simply as "semiconductor film" in this specification includes an amorphous semiconductor film in addition to a crystalline semiconductor film.

Also, the term "semiconductor element" in this specification designates a switching element and a memory element, for example, a thin film transistor (TFT), a thin film diode (TFD) or the like.

The present invention has another feature that a mask (such as a resist mask) is formed on the protective film to form an LDD region, which is subsequently patterned.

According to the present invention, there is provided a first method of manufacturing a semiconductor device provided with a semiconductor circuit consisting of a semiconductor element, comprising:

a first step of sequentially forming and layering, on a substrate having a gate wiring formed thereon, a gate insulating film, an initial semiconductor film and an insulating film without exposing them to the air;

a second step of crystallizing the initial semiconductor film by irradiating the film through the insulating film with infrared light or ultraviolet light to obtain a crystalline semiconductor film;

a third step of patterning the crystalline semiconductor film and the insulating film to form a protective film and an active layer an end face of which is flush with an end face of the protective film; and a fourth step of covering with a mask a region to be a channel formation region of the active layer, and adding through the protective film impurity elements that give N type or P type conductivity.

According to the present invention, there is provided a second method of manufacturing a semiconductor device provided with a semiconductor circuit consisting of a semiconductor element, comprising:

a first step of sequentially forming and layering, on a substrate having a gate wiring formed thereon, a gate insulating film, an initial semiconductor film and an insulating film without exposing them to the air;

a second step of crystallizing the initial semiconductor film by irradiating the film through the insulating film with infrared light or ultraviolet light to obtain a crystalline semiconductor film;

a third step of covering with a mask a region to be a channel formation region of the crystalline semiconductor film, and adding through the insulating film impurity elements that give N type or P type conductivity;

a fourth step of patterning the insulating film to form a protective film; and a fifth step of patterning the crystalline semiconductor film to form an active layer an end face of which is flush with an end face of the protective film.

According to the present invention, there is provided a third method of manufacturing a semiconductor device provided with a semiconductor circuit consisting of a semiconductor element, comprising:

a first step of sequentially forming and layering, on a substrate having a gate wiring formed thereon, a gate insulating film, an initial semiconductor film and an insulating film without exposing them to the air;

a second step of crystallizing the initial semiconductor film by irradiating the film through the insulating film with infrared light or ultraviolet light to obtain a crystalline semiconductor film;

a third step of patterning the crystalline semiconductor film and the insulating film to form a protective film and an active layer an end face of which is flush with an end face of the protective film;

a fourth step of covering with a first mask a region to be a channel formation region of the active layer, and adding through the protective film impurity elements that give N type or P type conductivity; and a fifth step of adding with the use of a second mask impurity elements that give N type or P type conductivity in a region to be a source region or a drain region of the active layer.

According to the present invention, there is provided a fourth method of manufacturing a semiconductor device provided with a semiconductor circuit consisting of a semiconductor element, comprising:

a first step of sequentially forming and layering, on a substrate having a gate wiring formed thereon, a gate insulating film, an initial semiconductor film and an insulating film without exposing them to the air;

a second step of crystallizing the initial semiconductor film by irradiating the film through the insulating film with infrared light or ultraviolet light to obtain a crystalline semiconductor film;

a third step of patterning the crystalline semiconductor film and the insulating film to form a protective film and an active layer an end face of which is flush with an end face of the protective film;

a fourth step of covering with a first mask a region to be a channel formation region of the active layer, and adding through the protective film impurity elements that give N type or P type conductivity;

a fifth step of adding with the use of a second mask impurity elements that give N type or P type conductivity in a region to be a source region or a drain region of the active layer; and a sixth step of removing the first mask and the second mask at once.

According to the present invention, there is provided a fifth method of manufacturing a semiconductor device provided with a semiconductor circuit consisting of a semiconductor element, comprising:

a first step of sequentially forming and layering, on a substrate having a gate wiring formed thereon, a gate insulating film, an initial semiconductor film and an insulating film without exposing them to the air;

a second step of crystallizing the initial semiconductor film by irradiating the film through the insulating film with infrared light or ultraviolet light to obtain a crystalline semiconductor film;

a third step of covering with a first mask a region to be a channel formation region of the crystalline semiconductor film, and adding through the insulating film impurity elements that give N type or P type conductivity;

a fourth step of adding with the use of a second mask impurity elements that give N type or P type conductivity in a region to be a source region or a drain region of the crystalline semiconductor film;

a fifth step of patterning the insulating film to form a protective film; and a sixth step of patterning the crystalline semiconductor film to form an active layer an end face of which is flush with an end face of the protective film.

According to the present invention, there is provided a sixth method of manufacturing a semiconductor device provided with a semiconductor circuit consisting of a semiconductor element, comprising:

a first step of sequentially forming and layering, on a substrate having a gate wiring formed thereon, a gate insulating film, an initial semiconductor film and an insulating film without exposing them to the air;

a second step of crystallizing the initial semiconductor film by irradiating the film through the insulating film with infrared light or ultraviolet light to obtain a crystalline semiconductor film;

a third step of covering with a first mask a region to be a channel formation region of the crystalline semiconductor film, and adding through the insulating film impurity elements that give N type or P type conductivity;

a fourth step of adding with the use of a second mask impurity elements that give N type or P type conductivity in a region to be a source region or a drain region of the crystalline semiconductor film;

a fifth step of removing the first mask and the second mask at once;

a sixth step of patterning the insulating film to form a protective film; and a seventh step of patterning the crystalline semiconductor film to form an active layer an end face of which is flush with an end face of the protective film.

In the third to sixth methods of manufacturing a semiconductor device according to the present invention, the method is characterized in that the first mask is a resist mask formed by irradiating the substrate from its back surface with light.

In the above respective manufacturing methods, the method is characterized in that the gate insulating film, the initial semiconductor film and the protective film are formed respectively using chambers different from one another.

In the above respective manufacturing methods, the method is characterized in that the gate insulating film and the protective film are formed using a first chamber, and the initial semiconductor film is formed using a second chamber.

In the above respective manufacturing methods, the method is characterized by further comprising a step of forming as the gate insulating film a laminated film including, among other layers, one layer of a silicon nitride film.

In the above respective manufacturing methods, the method is characterized by further comprising a step of forming as the gate insulating film a laminated film including, among other layers, one layer of a BCB (benzocyclobutene) film.

BRIEF DESCRIPTION OF THE DRAWING

In the accompanying drawings:

FIGS. 1A to 1D are views showing a manufacturing process of a TFT (Embodiment 1);

FIGS. 4A and 4B are top views respectively showing a pixel matrix circuit and a CMOS circuit (Embodiment 1);

DESCRIPTION OF THE PREFERRED EMBODIMENTS

Figure 2A:
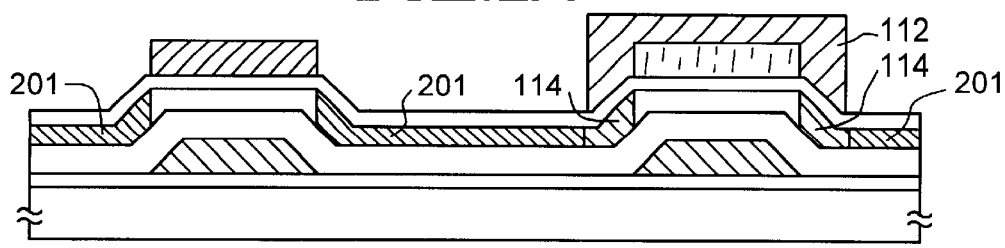
FIGS. 2A to 2E are views showing the manufacturing process of a TFT (Embodiment 1)
Figure 2B:
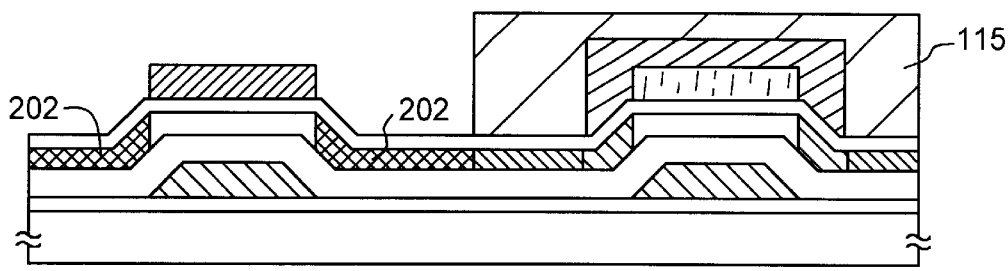
Figure 2C:
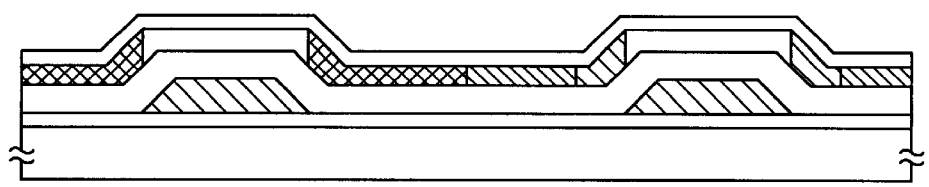
Figure 2D:
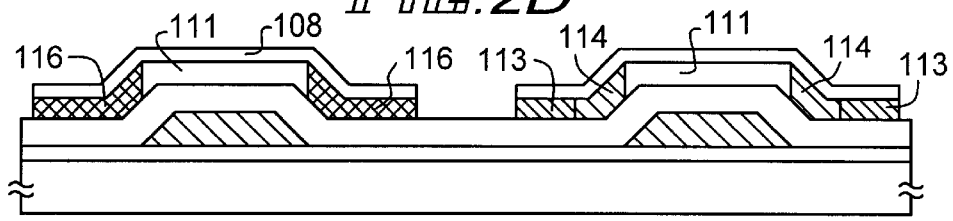
Figure 2E:
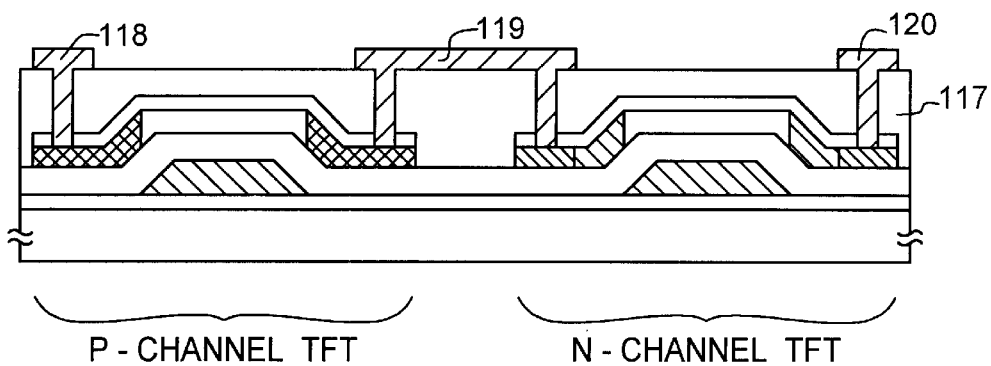

Detailed description will be made on embodiment modes of the present invention by means of Embodiments shown below.

Embodiments of the present invention will be described below, but, as a matter of course, the present invention is not particularly limited to those embodiments.

Embodiment 1

This embodiment explains an example in which a reversed stagger type TFT is manufactured using the present invention. In this embodiment, description will be made taking as an example a CMOS circuit that is comprised of an N channel type TFT and a P channel type TFT.

Description will be given in a simplified manner with reference to FIGS. 1A to 4B, which are simplified sectional views illustrating an embodiment mode of a semiconductor device and a manufacturing method thereof in accordance with the present invention.

First, a substrate 100 is prepared. A substrate that may be used as the substrate 100 includes: an insulating substrate such as a glass substrate, a quartz substrate or a crystalline glass substrate; a ceramic substrate; a stainless substrate; a metal (tantalum, tungsten, molybdenum, etc.,) substrate; a semiconductor substrate; and a plastic substrate (polyethylene terephthalate substrate). In this embodiment, a glass substrate (Corning 1737; 667° C. in distortion point) is used as the substrate 100.

Next, a base film 101 is formed on the substrate 100. The base film may be made using a silicon oxide film, a silicon nitride film, a silicon nitride oxide ($SiO_xN_y$) film or a laminated film in which those films are layered. The film thickness of the base film 101 ranges from 200 nm to 500 nm. In this embodiment, a silicon nitride film with a thickness of 300 nm is formed as the base film 101 to prevent diffusion of contaminants from the glass substrate. Incidentally, though the present invention may be carried out without providing a base film, provision of the base film is preferred in order to have good TFT characteristics.

A gate wiring 102 having a single-layer structure or a lamination structure is next formed. (FIG. 1A) The gate wiring 102 includes at least one layer containing as its main ingredient a conductive or semiconductive material, for example, aluminum (Al), tantalum (Ta), niobium (Nb), hafnium (Hf), zirconium (Zr), titanium (Ti), chromium (Cr), silicon (Si) and silicide. The film thickness of the gate wiring 102 ranges between 10 nm and 1,000 nm (preferably between 30 nm and 300 nm). In this embodiment, the gate wiring 102 has a lamination structure, though not shown for simplification, in which a tantalum film is sandwiched between two tantalum nitride films. Tantalum causes less shift in threshold of a TFT and is one of preferable materials, for it has work function close to that of silicon. A step of forming an anodic oxide film or an oxide film may be added in order to protect the gate wiring. Also may be added a step of forming an insulating film for covering the gate wiring and the substrate to prevent diffusion of impurities to a gate insulating film from the substrate and the gate wiring during the manufacturing steps.

Subsequently, a gate insulating film 103, an initial semiconductor film 104 and an insulating film 105 are sequentially formed and layered without exposing them to the air. At this time, any forming method such as the plasma CVD or the sputtering may be used, but it is important to expose to the air not a single interface out of the interfaces between respective layers so that contaminants from the air do not attach thereto. In this embodiment, with the use of a multi-chamber apparatus (the apparatus shown in FIG. 13) provided with a chamber exclusive to formation of a gate insulating film, a chamber exclusive to formation of an initial semiconductor film and a chamber exclusive to formation of an insulating film, the films are formed and layered by transferring the substrate from one chamber to another while maintaining highly vacuumed state.

Figure 13:
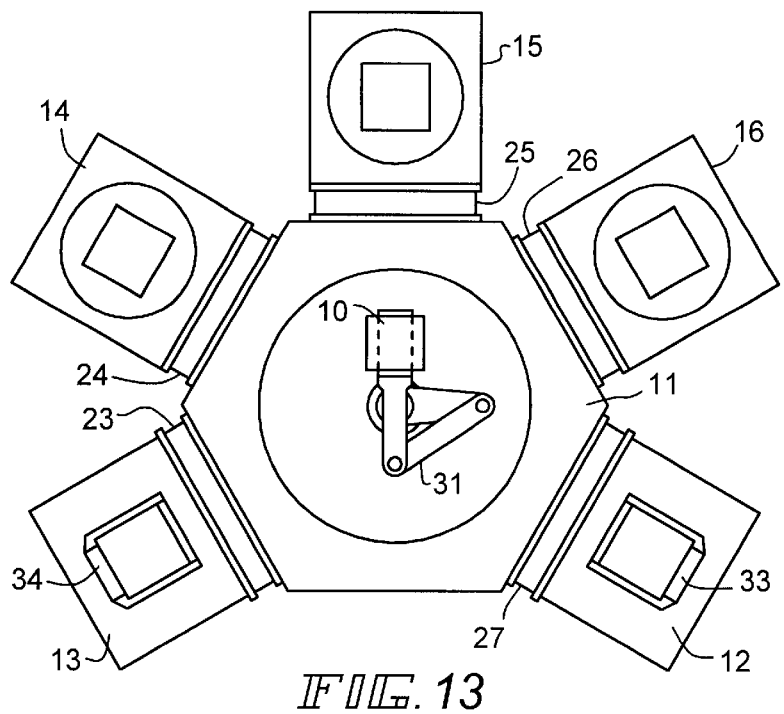
FIG. 13 is a view showing an example of a film formation apparatus (Embodiment 1)

FIG. 13 illustrates the outline seen from the above of the apparatus shown in this embodiment (a serial film formation system). In FIG. 13, reference numerals 12 to 16 denote air tight chambers. A vacuum pump and an inert gas introducing system are arranged in each chamber.

The chambers denoted by reference numerals 12 and 13 are load-lock chambers for carrying a sample 10 (substrate to be processed) in the system. The chamber 14 is a first chamber for forming the gate insulating film (silicon oxide nitride film) 103. The chamber 15 is a second chamber for forming the semiconductor film (amorphous silicon film) 104. The chamber 16 is a third chamber for forming the insulating film (silicon oxide nitride film) 105. Reference numeral 11 denotes a common chamber for a sample, which is arranged in common to the respective chambers.

An example of operation thereof will be shown below.

All the chambers, after once have been vacuum-evacuated into highly vacuumed state, at first are in a purged state (atmospheric pressure) with inert gas, here, nitrogen. Also, all gate valves are brought into a closed state.

First, the substrate to be processed is brought into the load-lock chamber 13 together with other substrates to be processed while being stored in a cassette 34. After the cassette is brought in, a not-shown door of the load-lock chamber is closed. In this state, a gate valve 23 is opened to take out of the cassette the substrate 10 to be processed, and a robot arm 31 takes the substrate to the common chamber 11. At this time, the substrate is positioned within the common chamber.

The gate valve 23 is now closed and, subsequently, a gate valve 24 is opened. The substrate 10 to be processed is then transferred to the first chamber 14. In the first chamber, a film formation process is performed at a temperature of 150 to 300° C. to obtain the gate insulating film 103. A film usable as the gate insulating film 103 is, for example, a silicon oxide film, a silicon nitride film, a silicon nitride oxide ($SiO_xN_y$) film or a laminated film in which those films are layered, and its film thickness ranges from 100 to 400 nm (typically, from 150 to 250 nm). Though an insulating film of a single layer is used as the gate insulating film in this embodiment, the gate insulating film may have the lamination structure of two layers or three or more layers.

After completion of film formation of the gate insulating film, the substrate 10 to be processed is pulled back by the robot arm 31 to the common chamber and is transferred to the second chamber 15. In the second chamber, a film formation process is performed at a temperature of 150 to 300° C., as in the first chamber, to obtain the initial semiconductor film 104. The initial semiconductor film 104 may be an amorphous silicon film, an amorphous semiconductor film containing microcrystals, a microcrystalline semiconductor film, an amorphous germanium film, an amorphous silicon germanium film expressed as $Si_xGe_{1-x}$ (0<X<1) or a laminated film in which those films are layered, and it has a film thickness ranging from 20 to 70 nm (typically, from 40 to 50 nm).

Incidentally, the initial semiconductor film 104 may be formed at a temperature of 350 to 500° C. (typically, 450° C.) to omit a heat treatment for reducing hydrogen concentration in the initial semiconductor film.

The heat treatment for reducing hydrogen concentration may be omitted also when a microcrystalline semiconductor film, that is formed at the formation temperature of 80 to 300° C., preferably 140 to 200° C., using silane gas diluted with hydrogen ($SiH_4:H_2$=1:10 to 100) as reaction gas under a gas pressure of 0.1 to 10 Torr at an electric discharge power of 10 to 300 mW/cm$^2$, is used as the initial semiconductor film because of its low hydrogen concentration in the film.

After completion of film formation of the initial semiconductor film, the substrate 10 to be processed is pulled back by the robot arm 31 to the common chamber and is transferred to the third chamber 16. In the third chamber, a film formation process is performed at a temperature of 150 to 300° C., as in the first chamber, to obtain the insulating film 105. A film usable as the insulating film 105 may be a silicon oxide film, a silicon nitride film, a silicon nitride oxide (expressed as $SiO_xN_y$) film or a laminated film in which those films are layered, and its film thickness ranges from 5 to 50 nm (typically, from 10 to 20 nm). This insulating film 105 is provided to protect the surface of the initial semiconductor film 104 against contamination caused by impurities contained in the air. The insulating film 105, having excellent coherence to a resist, is preferable in forming a resist mask later.

The processed substrate on which three layers are thus serially formed is transferred by the robot arm to the load-lock chamber 12 and is stored in a cassette 33.

As is described, in this embodiment, each layer is formed, with the use of the apparatus shown in FIG. 13, in a chamber different from ones where rest of the layers are formed so that contamination (inhibition of crystallization mainly by oxygen) that takes place upon film formation of the insulating film is prevented. It is needless to say that the apparatus shown in FIG. 13 is merely an example.

In this embodiment, a silicon nitride oxide film with a film thickness of 125 nm is formed as the gate insulating film 103, an amorphous silicon film with a film thickness of 50 nm is formed as the initial semiconductor film 104 and a silicon nitride oxide film with a film thickness of 15 nm is formed as the insulating film 105, which are layered. (FIG. 1B) Each film thickness is of course not limited to one in this embodiment, and is determined on discretion of a person who carries out the invention. In addition, an alternative construction may be taken, in which the films are formed and layered in the same chamber while replacing one reaction gas with other reaction gas.

After the state shown in FIG. 1B is thus obtained, irradiation with infrared light or ultraviolet light is performed on the initial semiconductor film 104 for its crystallization (hereinafter, referred to as laser crystallization). When ultraviolet light is chosen as a crystallizing technique, excimer laser light or intense light emitted from an ultraviolet lamp is sufficiently used, and when infrared light is chosen, infrared laser light or intense light emitted from an infrared lamp is sufficiently used. In this embodiment, excimer laser light is beam-shaped into a linear shape to irradiate. The irradiation condition consists of a pulse frequency of 150 Hz, an overlap ratio of 80 to 98%, 96% in this embodiment, and laser energy density of 100 to 500 mJ/cm$^2$, preferably 150 to 200 mJ/cm$^2$, 175 mJ/cm$^2$, in this embodiment. Condition on the laser crystallization (such as wavelength of laser light, overlap ratio, irradiation intensity, pulse width, repetition frequency and irradiation time) may be properly determined by a person who carries out the invention in consideration for the film thickness of the insulating film 105, the film thickness of the initial semiconductor film 104, the substrate temperature and the like. Depending on laser crystallization condition, the initial semiconductor film may be crystallized after it passes melted state, or the initial semiconductor film may be crystallized in a state of solid phase or in the middle state of solid phase and liquid phase. The laser light is continuously moved at a constant rate and an amount of laser light in any irradiated region is made even within an overlap ratio range of ±10%.

Through this step, the initial semiconductor film 104 is crystallized and changed into a crystalline semiconductor film (semiconductor film containing crystals) 106. (FIG. 1C) The crystalline semiconductor film in this embodiment is a polycrystalline silicon film. The initial semiconductor film is irradiated with laser light through the insulating film 105 at this step, so that there is no fear of contaminants from the air being mixed in the initial semiconductor film. That is, the initial semiconductor film is crystallized while the interface thereof is kept clean.

Incidentally, an additional step may be put after the step of FIG. 1C, in which impurities are added to control the threshold and a region to be a channel formation region is added with impurities through a protective film.

The substrate is next exposed to light from its back surface to form first masks (first resist masks) 109 so that the masks are brought into contact with the insulating film 105 above the gate wiring. A material used for the mask includes a positive type or negative type photosensitive organic material (for example, a resist material), a silicon oxide film, a silicon nitride film and a silicon nitride oxide (expressed as SiO$_x$N$_y$) film. Formation of a resist mask through the exposure to light from the back surface does not need a photo mask, which reduces in number the masks to be produced. In some cases, actually, the width of the first resist masks is reduced by the light that rounds and reaches the mask to have a slightly smaller width than that of the gate wiring. However, it does not shown for the purpose of simplification.

In this specification, the direction leaving the substrate is called the upper and the direction approaching the substrate is called the lower when the substrate 100 is cut with a plane perpendicular to the substrate surface.

The first masks 109 are then used to conduct a first impurity addition through the insulating film 105, thereby forming lightly doped regions (n$^-$ regions) 110. (FIG. 1D) In this embodiment, phosphorous elements are employed as impurities giving N type conductivity, and the concentration of phosphorus in the n$^-$ regions denoted by 110 is adjusted to $1\times10^{15}$ to $1\times10^{17}$ atoms/cm$^3$ when analyzed by SIMS.

A second mask (second resist mask) 112 formed to cover the first mask of the N channel type TFT is used to conduct a second impurity addition through a protective film 108, thereby forming heavily doped regions (n$^+$ regions) 201. (FIG. 2A) In this embodiment, the concentration of phosphorus in the n$^+$ regions denoted by 201 is adjusted to $1\times10^{20}$ to $8\times10^{21}$ atoms/cm$^3$ when analyzed by SIMS.

Through the first and the second impurity addition steps described above, the LDD structure is formed. The boundary between the n$^-$ region and the n$^+$ region is defined depending on the shape of the second mask 112. In the N channel type TFT, the n$^+$ regions 201 serve as a source region or a drain region, and the n$^-$ regions serve as lightly doped regions 114.

Subsequently, the N channel type TFT is covered with a third mask (third resist mask) 115 to conduct a third impurity addition through the protective film 108, thereby forming heavily doped regions (P regions) 202. (FIG. 2B) In this embodiment, boron elements are employed as impurities giving P type conductivity, and dose of boron is determined so that the concentration of boron ions in the P regions is about 1.3 to 2 times the concentration of phosphorus ions added in the n$^+$ regions.

In the P channel type TFT, the P region 202 becomes a source region or a drain region. A region in which neither phosphorus ions nor boron ions are implanted later becomes an intrinsic or substantially intrinsic channel formation region 111 which serves as a moving path for carriers.

In this specification, an "intrinsic region" denotes a region containing no impurity at all which may change Fermi level of silicon, and a "substantially intrinsic region" denotes a region in which the numbers of electron and of hole are utterly equal to offset the conductivity types that are opposite to each other, in other words, a region containing impurities giving N type or P type in such a concentration range as the threshold may be controlled ($1\times10^{15}$ to $1\times10^{17}$ atoms/cm$^3$ by SIMS analyzation), or a region in which the conductivity types are offset by intentionally adding impurities of which the conductivity is opposite to the conductivity of impurities that have been contained in the region.

The first to third impurity addition described above may be performed using a known method such as ion implantation, plasma doping and laser doping. However, doping condition, dose, acceleration voltage and the like should be adjusted so as to impurity ions are added passing through the protective film 108 into a predetermined region by a desired amount.

At the first to third impurity addition above, impurities are implanted through the insulating film 105, causing no fear of contaminants, boron in particular, from the air being mixed in the active layer. Accordingly, the concentration of impurities in the active layer may be controlled to suppress the fluctuation in the threshold.

Patterns of the first to third resist masks mentioned above may properly be set by a person who carries out the invention to relatively easily obtain the n$^-$ region, the n$^+$ region, the P region and the channel formation region which have desired widths, respectively. Also, a person who carries out the invention may properly set the formation order of the n$^-$ region, the n$^+$ region and the P region by changing the formation order of the first to third masks and the doping order.

After forming the heavily doped regions 201 and 202 which are to be source regions or drain regions and the lightly doped regions 114 in this way, the first to third resist masks are removed at once, or at twice or three times. Made of the same material, the masks are easy to remove at once and to shorten the time required for production may be aimed. (FIG. 2C) At this removing step of the resist, the insulating film 105 serves as an etching stopper. In this removing step of the resist also, contaminants does not mixed in the crystalline semiconductor film, in particular, the channel formation region 111, owing to the insulating film (protective film) formed.

Then, thermal annealing or laser annealing, for example, is performed, which is a known technique for obtaining an effect of activating impurities in the source region and the drain region, or an effect of recovering the crystal structure of the active layer impaired at the doping step.

Using the same mask, the crystalline silicon film and the insulating film 105 are subsequently patterned to form the active layer (consisting of the n⁻ regions 114, n⁺ regions 113, P regions 116 and the channel formation region 111) and the protective film 108. (FIG. 2D) In this way, a state in which the crystalline silicon film is covered with the insulating film 105 is maintained as long as possible to protect the film against contamination from the air. The gate insulating film may be selectively removed using the same mask. The patterning may be performed prior to the adding step in the impurity regions.

Finally, an interlayer insulating film 117 is formed and contact holes for exposing the source region and the drain region are formed. Thereafter, a metal film is formed and patterned to form metal wirings 118 to 120 that are in contact with the source region and the drain region. (FIG. 2E) Thus is completed the manufacture of a CMOS circuit comprised of an N channel type TFT and a P channel type TFT in accordance with this embodiment.

With the employment of the apparatus shown in FIG. 13, the concentration of oxygen and the concentration of carbon or nitrogen may be reduced down to $2 \times 10^{19}$ atoms/cm³ or less and to $5 \times 10^{18}$ atoms/cm³ or less, respectively, at the interface between the gate insulating film and the channel formation region or at the interface between the protective film and the channel formation region.

Description will be made with reference to FIG. 3 on an example of the structure of a semiconductor device provided with a semiconductor circuit consisting of a semiconductor element fabricated by the manufacturing process above. A semiconductor device according to the present invention is provided with a peripheral drive circuit portion and a pixel matrix circuit portion which are formed on the same substrate. In this embodiment, for the purpose of simple illustration, shown in the drawings are a CMOS circuit constituting a part of the peripheral drive circuit portion and a pixel TFT (an N channel type TFT) constituting a part of the pixel matrix circuit, which are formed on the same substrate.

Figure 3:
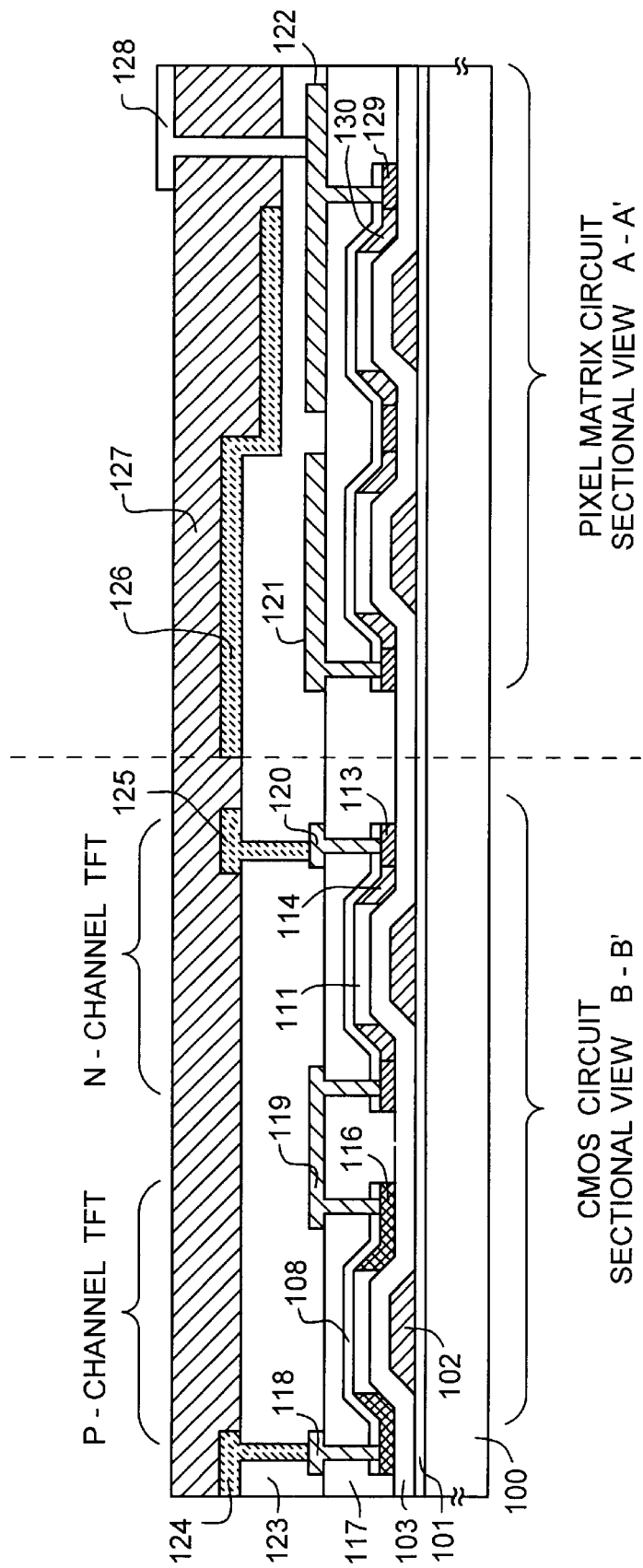
FIG. 3 is a sectional view showing an example of the structure of a semiconductor device (Embodiment 1)

FIGS. 4A and 4B are views corresponding to the top view of the circuits shown in FIG. 3, and a portion cut along the dashed line A–A' in FIG. 4A corresponds to the sectional structure of the pixel matrix circuit in FIG. 3 and a portion cut along the dashed line B–B' in FIG. 4B corresponds to the sectional structure of the CMOS circuit in FIG. 3. Reference numerals used in FIG. 3 and FIGS. 4A and 4B are identical with those in FIGS. 1A to 1D, or in FIGS. 2A to 2E.

In FIG. 3, every TFT (thin film transistor) is formed on the base film 101 provided on the substrate 100. In the case of the P channel type TFT of the CMOS circuit, the gate wiring 102 is formed on the base film and the gate insulating film 103 is provided thereon. The P regions 116 (a source region or a drain region) and the channel formation region 111 are formed as an active layer on the gate insulating film. The active layer is protected by the protective film 108 that has the same shape as the active layer. Contact holes are formed in the first interlayer insulating film 117 that covers the upper surface of the protective film 108, wirings 118 and 119 are connected with the P regions 116, a second interlayer insulating film 123 is further formed thereon, an extraction wiring 124 is connected to the wiring 118 and a third interlayer insulating film 127 is formed thereon to cover the wirings.

On the other hand, an active layer in the N channel type TFT includes n⁺ regions 113 (a source region or a drain region), a channel formation region 111 and n⁻ regions 114 and 130 that are formed between the n⁺ region and the channel formation region. On the n⁺ regions 113, the wiring 119 and a wiring 120 are formed and an extraction wiring 125 is connected to the wiring 120. As regards portions other than the active layer, the N channel type TFT has the structure substantially similar to that of the P channel type TFT described above.

The N channel type TFT formed in the pixel matrix circuit goes through some fabrication steps until when the first interlayer insulating film 117 is formed to have the same structure as that of the N channel type TFT in the CMOS circuit. Wirings 121 and 122 are connected with n⁺ regions 129, and formed thereon are the second interlayer insulating film 123 and a black mask 126. This black mask covers the pixel TFT and forms together with the wiring 122 an auxiliary capacitance. Further thereon, the third interlayer insulating film 127 is formed and is connected to a pixel electrode 128 made of a transparent conductive film such as an ITO or $SnO_2$ film. A transmission type LCD is formed in this embodiment as an example, but the invention is not particularly limited thereto. For instance, a reflection type LCD may be manufactured if a metal material having reflectivity is used as a material for the pixel electrode and patterning of the pixel electrode is changed, or some steps are properly added/eliminated.

In this embodiment, the gate wiring of the pixel TFT in the pixel matrix circuit has the double gate structure. However, it may have the multi-gate structure such as the triple gate structure to reduce fluctuation in OFF current. It may alternatively have the single gate structure to improve aperture ratio.

Embodiment 2

This embodiment is an example in which a crystalline silicon film is obtained by a method different from one in Embodiment 1. According to the method in this embodiment, a crystalline silicon film is obtained by, utilizing catalytic elements for promoting crystallization of silicon, a laser crystallization process in which a region of several to several hundreds centimeters square is uniformly irradiated with one irradiation of laser light that is beam-shaped into a rectangular or a square. Having almost the same construction as Embodiment 1, this embodiment will be described while restricting to difference between them.

In this embodiment, excimer laser light is shaped like a plane to irradiate at the step of FIG. 1C. When laser light is shaped like a plane, the laser light has to be shaped so as to irradiate an area of about several tens centimeters square (preferably 10 cm² or more) at once. In order to anneal the entire irradiated area with a desired laser energy density, an laser apparatus of 5 J or more in the total energy output, preferably 10 J or more, is used.

In that case, it is preferable to set the laser energy density to 100 to 800 mJ/cm² and to set the output pulse width to 100 nsec or more, preferably 200 nsec to 1 msec. To realize the pulse width as large as 200 nsec to 1 msec, a plurality of laser apparatuses are coupled and synchronism of each laser apparatus is differentiated with one another to produce a state in which a plurality of pulses are mixed.

Irradiation with laser light having a beam shape like a plane as in this embodiment makes it possible to uniformly irradiate a large area with laser. Namely, crystallinity (including grain size, defect density and the like) of the active layer is homogenized to reduce fluctuation in electrical characteristics among TFTs.

This embodiment is readily combined with Embodiment 1, and no restriction is put on how to combine those.

Embodiment 3

Figure 5:
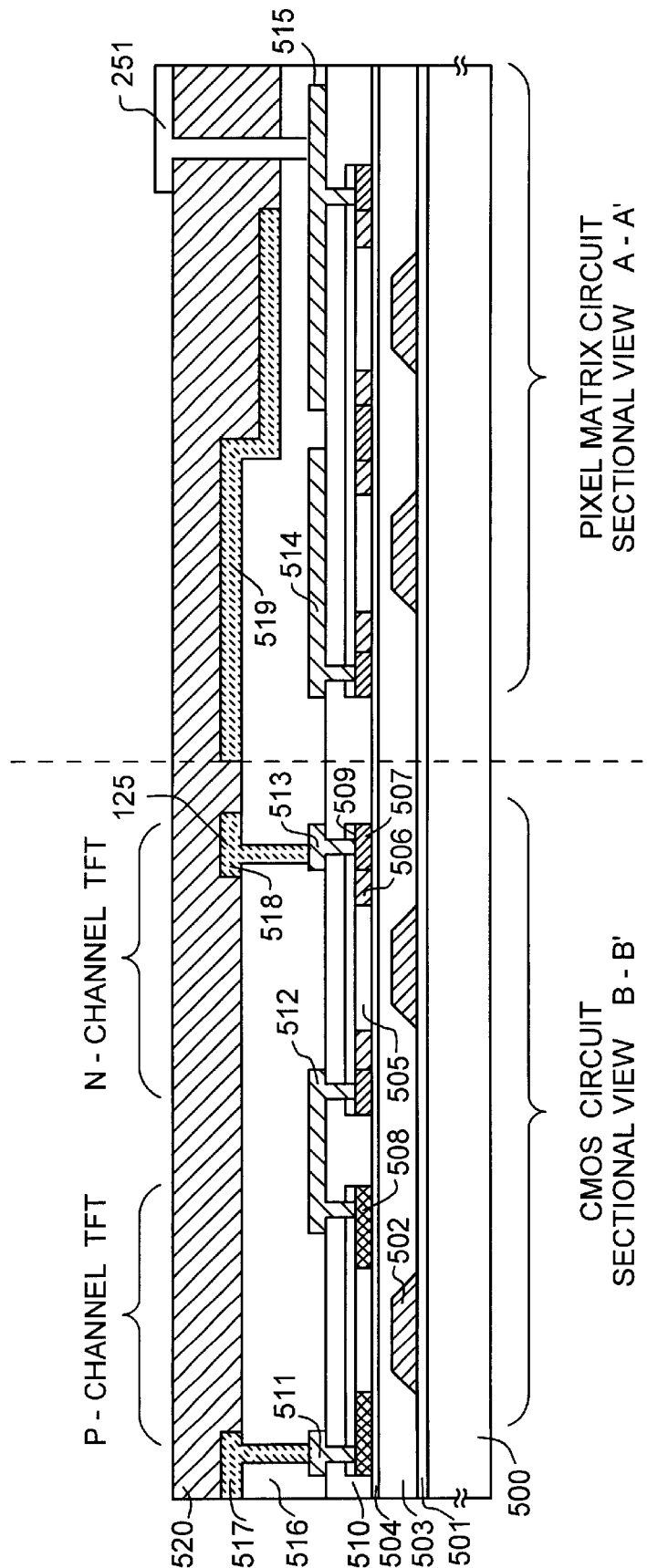
FIG. 5 is a sectional view showing an example of the structure of a semiconductor device (Embodiment 3)

In this embodiment, description will be made with reference to FIG. 5 on an example in which a TFT having a different structure from that of the TFT in Embodiment 1 is manufactured. The top views of the circuits shown in FIG. 5 are almost the same as the views of FIGS. 4A and 4B, though the reference numerals are not identical.

In this embodiment, a plastic substrate is formed as a substrate 500, a silicon oxide nitride (expressed as $SiO_xN_y$) film is formed as a base film 501 and a tantalum film is formed as a gate wiring 502.

Next, a BCB (benzocyclobutene) film with a thickness of 100 nm to 1 μm (preferably 500 to 800 nm) is formed as the first insulating film 503. At this step, the film thickness needs to be thick enough to completely flatten the level difference due to the gate wiring 502. Having a great effect in flattening, a BCB film of not so thick a film thickness may sufficiently flatten the difference.

After formation of the first insulating film 503, a second insulating film (silicon nitride oxide film) 504, an initial semiconductor film (microcrystalline silicon film) and an insulating film (silicon nitride oxide film) for serving as a protective film 509 are sequentially formed and layered without exposing them to the air. The microcrystalline silicon film is formed at a formation temperature of 80 to 300° C., preferably 140 to 200° C., using as reaction gas silane gas diluted with hydrogen ($SiH_4$: $H_2$=1:10 to 100), setting the gas pressure to 0.1 to 10 Torr and setting the electric discharge power to 10 to 300 $mW/cm^2$. When used as the initial semiconductor film, the microcrystalline silicon film that has low hydrogen concentration within the film makes it possible to omit a heat treatment for reducing the hydrogen concentration. This embodiment prepares a chamber dedicated for formation of the second insulating film, a chamber dedicated for formation of the initial semiconductor film and a chamber dedicated for formation of the protective film to serially form those films by transferring the substrate from one chamber to another while keeping highly vacuumed state. The insulating films and the semiconductor film thus serially formed are all flat as they are formed on the flat surface.

The semiconductor film is subsequently irradiated with excimer laser light through the protective film to be changed into a semiconductor film containing crystals (polycrystalline silicon film). The condition on this laser crystallization step is the same as in Embodiment 1. At this point, the semiconductor film being flat leads to obtainment of a polycrystalline silicon film of uniform grain size. Instead of the laser light irradiation, intense light irradiation such as RTA or RTP may be employed.

As described above, a semiconductor film having a flat surface may be obtained by using as the first insulating film 503 a BCB film that is advantageous in flattening. Uniform crystallinity may therefore be ensured over the entire area of the semiconductor film.

Subsequent steps follow the steps in Embodiment 1, and a semiconductor device shown in FIG. 5 is thus completed.

In FIG. 5, every TFT (thin film transistor) is formed on the base film 501 provided on the substrate 500. In the case of the P channel type TFT in the CMOS circuit, the gate wiring 502 is formed on the base film, and the first insulating film 503 made of a BCB film and the second insulating film 504 are provided thereon. P regions 508 (a source region or a drain region) and a channel formation region 505 are formed as an active layer on the second insulating film. The active layer is protected by the protective film 509 that has the same shape as the active layer. Contact holes are formed in a first interlayer insulating film 510 that covers the upper surface of the protective film 509, wirings 511 and 512 are connected with the P regions 508, a second interlayer insulating film 516 is further formed thereon, an extraction wiring 517 is connected to the wiring 511 and a third interlayer insulating film 520 is formed thereon to cover the wirings.

On the other hand, an active layer in the N channel type TFT includes $n^+$ regions 507 (a source region or a drain region), a channel formation region 505 and $n^-$ regions 506 that are formed between the $n^+$ regions and the channel formation region. On the $n^+$ region 507, the wiring 512 and a wiring 513 are formed and an extraction wiring 518 is connected to the wiring 513. As regards portions other than the active layer, the N channel type TFT has the structure substantially similar to that of the P channel type TFT described above.

The N channel type TFT formed in the pixel matrix circuit goes through some fabrication steps until when the first interlayer insulating film 510 is formed to have the same structure as that of the N channel type TFT in the CMOS circuit. Then, wirings 514 and 515 are connected with the $n^+$ regions 507, and formed thereon are the second interlayer insulating film 516 and a black mask 519. This black mask covers the pixel TFT and forms together with the wiring 515 an auxiliary capacitance. Further thereon, the third interlayer insulating film 520 is formed and is connected to a pixel electrode 521 made of a transparent conductive film such as an ITO film.

A TFT manufactured by carrying out this embodiment exhibits electrical characteristics with less fluctuation. This embodiment may be combined with Embodiment 1 or Embodiment 2.

Embodiment 4

Figure 6:
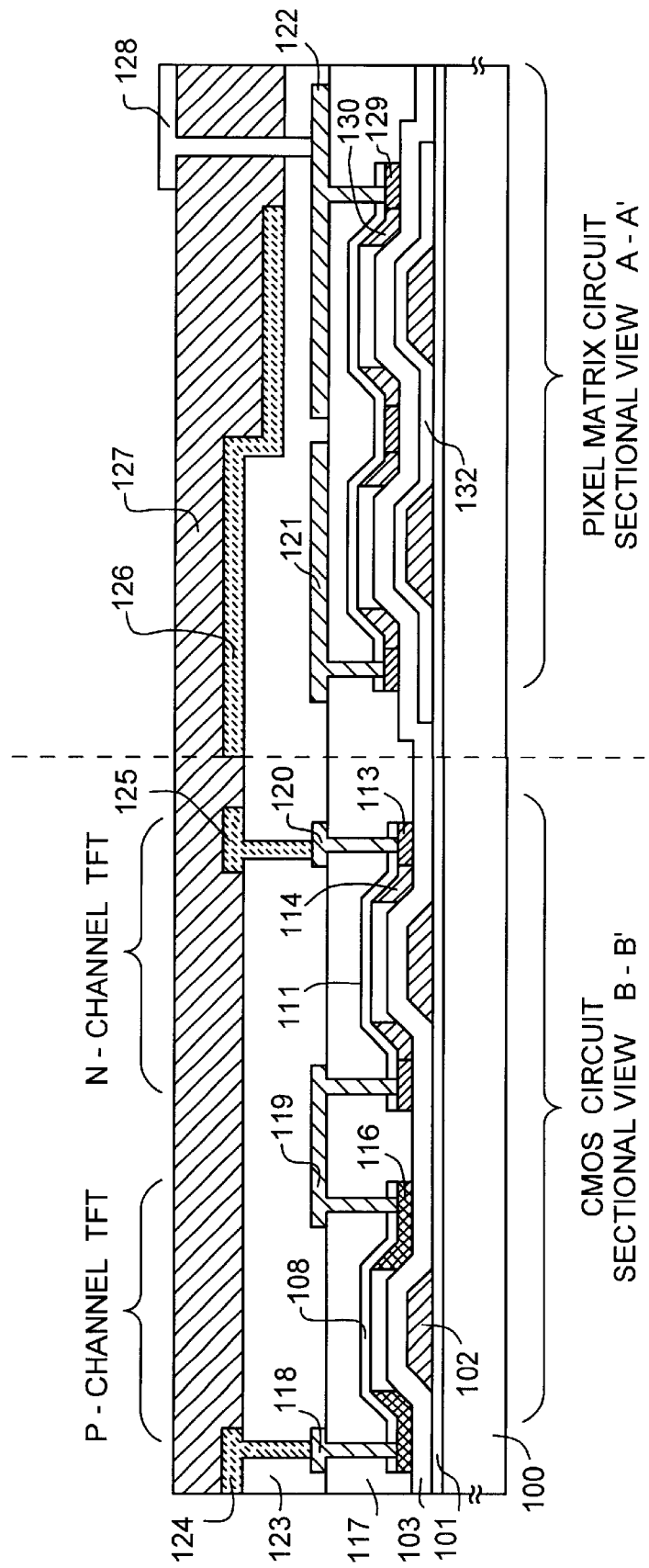
FIG. 6 is a sectional view showing an example of the structure of a semiconductor device (Embodiment 4)

In this embodiment, description will be made with reference to FIG. 6 on an example in which a TFT having a different structure from that of the TFT in Embodiment 1 is manufactured. Since the CMOS circuit has almost the same construction as that of the CMOS circuit in Embodiment 1, description will be given restricting to difference between them. Reference numerals used in FIG. 6 are the same as ones in FIGS. 1A to 1D or in FIGS. 2A to 2E. The top views of the circuits in FIG. 6 correspond to the views of FIGS. 4A and 4B.

This embodiment tracks the same way as in Embodiment 1 up through the steps of preparing a glass substrate as the substrate 100, forming a silicon oxide nitride (expressed as $SiO_xN_y$) film as the base film 101 and forming the gate wiring 102.

Subsequently, in this embodiment, a first insulating film 132 is selectively formed in the pixel matrix circuit.

Thereafter, as in Embodiment 1, a second insulating film (corresponding to the gate insulating film in Embodiment 1) 103, the initial semiconductor film 104 and the insulating film 105 are sequentially formed and layered without exposing them to the air. In this embodiment, a silicon nitride oxide film having a thickness of 10 to 100 nm, an amorphous silicon film having a thickness of 50 nm and a silicon nitride oxide film having a thickness of 15 nm are formed and layered as the second insulating film 103, the initial semiconductor film 104 and the insulating film 105, respectively, in the same chamber while maintaining highly vacuumed state. Each film thickness is of course not limited to that in this embodiment and is properly determined by a person who carries out the invention. In this embodiment, the gate insulating film (consisting of the first insulating film 132 and the second insulating film 103) in the pixel matrix circuit is formed so as to have the total film thickness of 100 to 300 nm.

When the films are serially formed in the same chamber as in this embodiment, contaminants, oxygen in particular, on a surface where the film is formed should be reduced by active hydrogen or an active hydrogen compound before forming the initial semiconductor film. Oxygen contained in the initial semiconductor film inhibits crystallization. Here, with active hydrogen or an active hydrogen compound that is produced by a plasma treatment using reaction gas such as $NH_3$, $H_2$, Ar and He, oxygen adhered to the inner wall of the chamber and to the electrode is changed into an OH group for gasification, to thereby prevent oxygen from being mixed in at the film formation step of the initial semiconductor film. Further, it is preferable to set the film formation temperature of each film to the same value (±50° C.), and to form each film at the same pressure (±20%) in the same chamber while maintaining highly vacuumed state.

Subsequent steps follow the steps in Embodiment 1, and a semiconductor device shown in FIG. 6 is thus completed.

In FIG. 6, the CMOS circuit has almost the same construction as in Embodiment 1 shown in FIG. 3, and hence description thereof is omitted. The N channel type TFT formed in the pixel matrix circuit is substantially similar to that of Embodiment 1 shown in FIG. 3, except that the gate insulating film in FIG. 6 has a two-layer structure (consisting of the first insulating film 132 and the second insulating film 103). In this way, to selectively thicken the film thickness of the gate insulating film improves reliability in a circuit where high withstand voltage is required (such as a pixel matrix circuit and a buffer circuit).

A TFT manufactured by carrying out this embodiment exhibits electrical characteristics with less fluctuation. This embodiment may be combined with any one of Embodiments 1 through 3.

Embodiment 5

Figure 7:
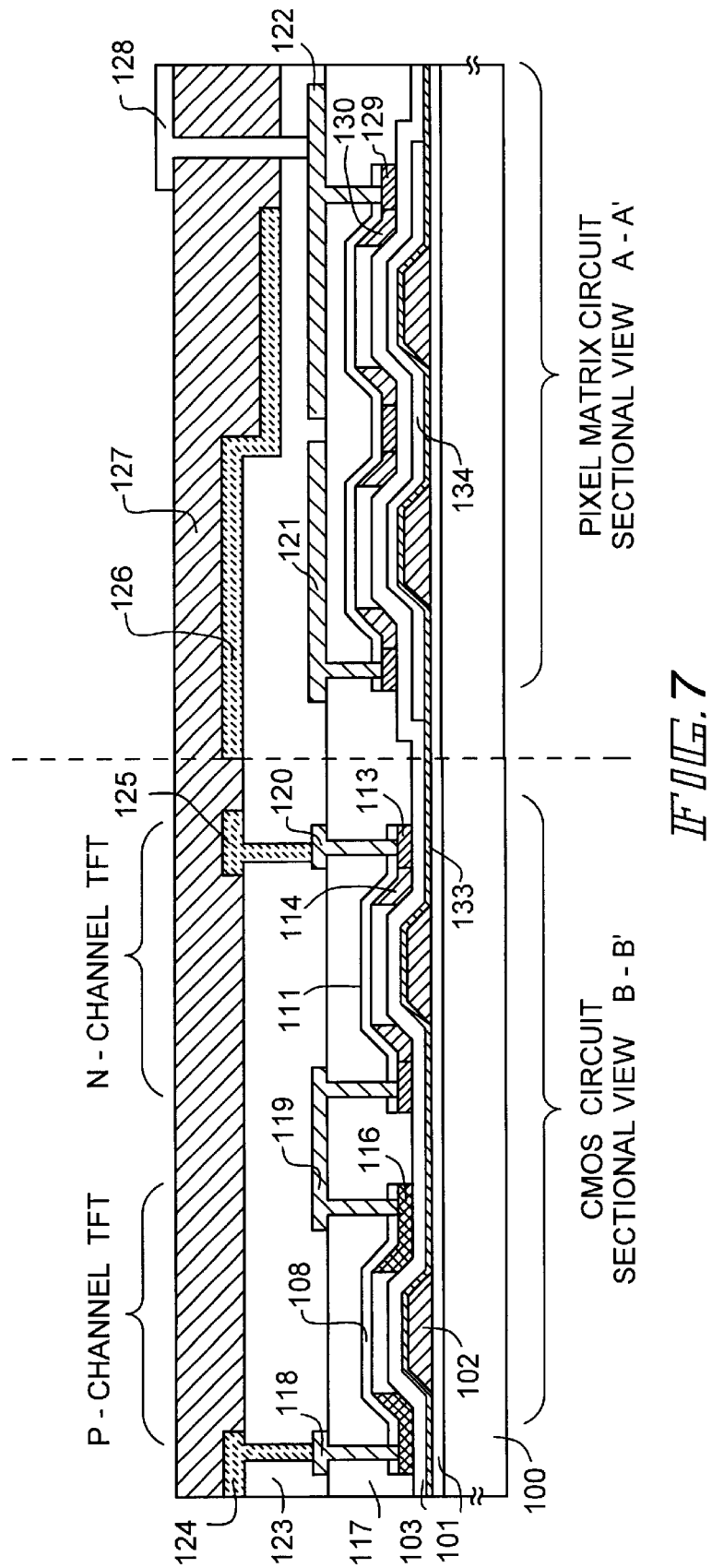
FIG. 7 is a sectional view showing an example of the structure of a semiconductor device (Embodiment 5)

In this embodiment, description will be made with reference to FIG. 7 on an example in which a TFT having a different structure from that of the TFT in Embodiment 1 is manufactured. The only difference in construction between the CMOS circuits in this embodiment and in Embodiment 1 is that the gate insulating film of the CMOS circuit in this embodiment is of a two-layer structure, and the two CMOS circuits are almost the same. Reference numerals used in FIG. 7 are identical with ones in FIGS. 1A to 1D or FIGS. 2A to 2E. The top views of the circuits in FIG. 7 correspond to the views of FIGS. 4A and 4B.

This embodiment tracks the same way as in Embodiment 1 up through the steps of preparing a glass substrate as the substrate 100, forming a silicon oxide nitride (expressed as $SiO_xN_y$) film as the base film 101 and forming the gate wiring 102.

Subsequently, in this embodiment, a first insulating film 133 made of a silicon nitride film is formed on the entire surface, and then a second insulating film 134 is selectively formed in the pixel matrix circuit.

Thereafter, as in Embodiment 1, a third insulating film (corresponding to the gate insulating film in Embodiment 1) 103, the initial semiconductor film and the insulating film are sequentially formed and layered without exposing them to the air. In this embodiment, a silicon nitride oxide film having a thickness of 10 to 100 nm, an amorphous silicon film having a thickness of 50 nm and a silicon nitride oxide film having a thickness of 15 nm are formed and layered as the third insulating film 103, the initial semiconductor film and the insulating film, respectively, with the use of the apparatus shown in FIG. 13. Each film thickness is of course not limited to that in this embodiment and is properly determined by a person who carries out the invention. In this embodiment, the gate insulating film (consisting of the first insulating film 133, the second insulating film 134 and the third insulating film 103) in the pixel matrix circuit is formed so as to have the total film thickness of 100 to 300 nm.

Subsequent steps follow the steps in Embodiment 1, and a semiconductor device shown in FIG. 7 is thus completed.

In FIG. 7, the CMOS circuit has almost the same structure as that of Embodiment 1 shown in FIG. 3, except for the gate insulating film having a two-layer structure (consisting of the first insulating film 133 and the third insulating film 103), and hence description thereof is omitted. The N channel type TFT formed in the pixel matrix circuit is substantially similar to the N channel type TFT in Embodiment 1 shown in FIG. 3, except that the gate insulating film in FIG. 7 has a three-layer structure (consisting of the first insulating film 133, the second insulating film 134 and the third insulating film 103). In this way, to selectively thicken the film thickness of the gate insulating film improves reliability in a circuit where high withstand voltage is required (such as a pixel matrix circuit and a buffer circuit).

A TFT manufactured by carrying out this embodiment exhibits electrical characteristics with less fluctuation. This embodiment may be combined with any one of Embodiments 1 through 3.

Embodiment 6

Figure 8A:
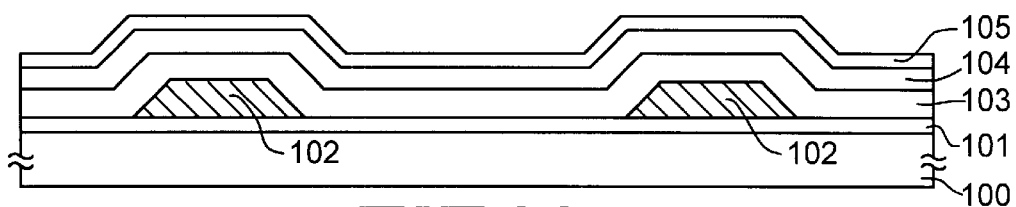
FIGS. 8A to 8E are views showing a manufacturing process of a TFT (Embodiment 6)
Figure 8B:
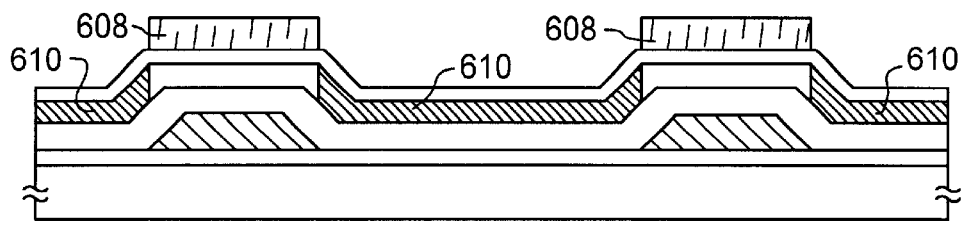

In this embodiment, description will be made with reference to FIGS. 8A to 8E and FIG. 9 on an example of manufacturing a TFT that is different in an LDD structure from the TFT of Embodiment 1. This embodiment follows the steps up through the step of FIG. 1C in Embodiment 1, and a view corresponding to FIG. 1C is shown in FIG. 8A. Reference numerals used in FIGS. 8A to 8E and FIG. 9 are identical with ones in FIGS. 1A to 1D or FIG. 3. The top views of the circuits in FIG. 9 are almost the same as the views of FIGS. 4A and 4B, though the reference numerals are different.

Figure 8C:
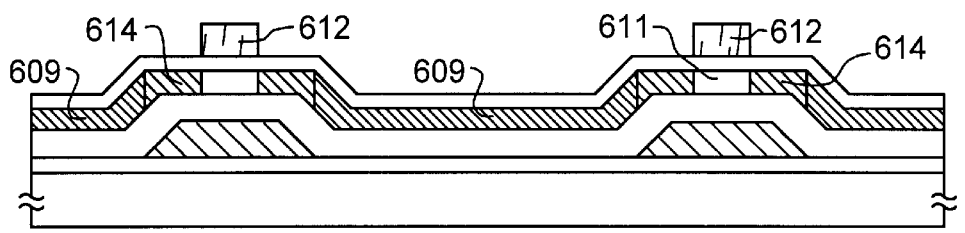
Figure 8D:
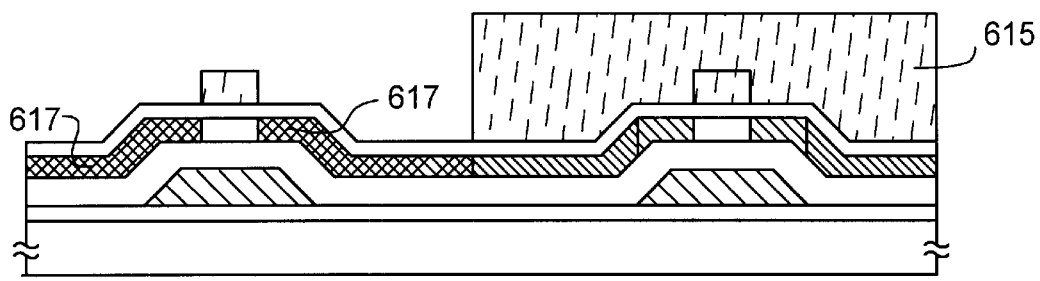
Figure 9:
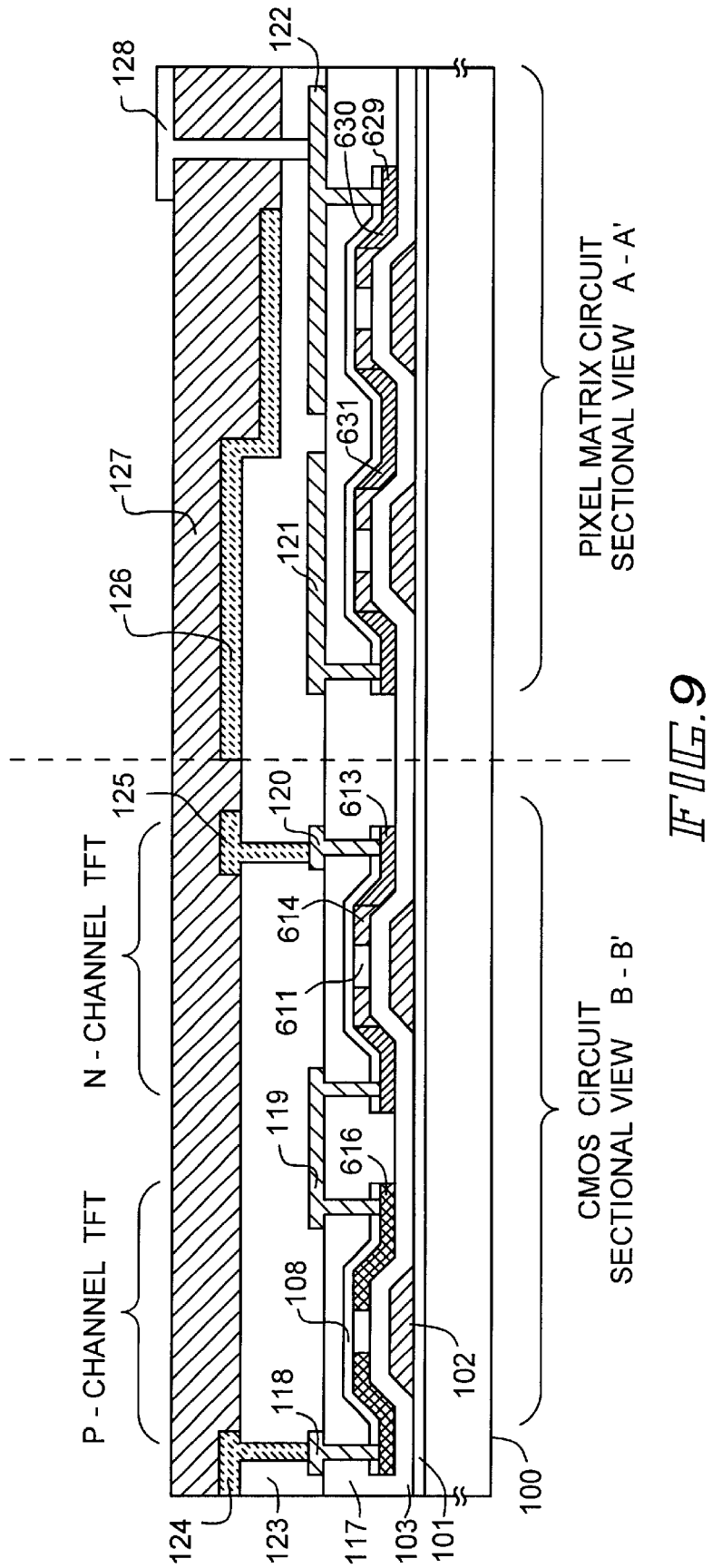
FIG. 9 is a sectional view showing an example of the structure of a semiconductor device (Embodiment 6)

One of the features of this embodiment is, as shown in FIG. 8C, that lightly doped regions ($n^-$ regions) 614 are formed above a gate wiring.

In this embodiment, a state of FIG. 8A is obtained through the same steps as ones in Embodiment 1, and therefore description is omitted.

After the substrate is exposed to light from its back surface, as in Embodiment 1, to form a first resist mask 608 having a shape almost the same as that of the gate wiring, impurities are added to form heavily doped regions ($n^+$ regions) 610. (FIG. 8B)

Subsequently, the first resist mask 608 is processed or removed, a second resist mask 612 smaller in width than the gate wiring is then formed and impurities are added to form lightly doped regions ($n^-$ regions) 614. In this embodiment, the second resist mask 612 smaller in width than the gate wiring is formed by an ordinary patterning method. Thus, the LDD structure is formed. At this time, phosphorus is further added in the heavily doped regions 610 to form regions denoted by reference numeral 609. Similarly, phosphorus elements are added also in the second resist mask. (FIG. 8C).

The first resist mask 608 or the second resist mask 612 may be formed by a formation method employing ordinary patterning or by a method in which the substrate is exposed to light from its back surface, the light being emitted intentionally round the gate wiring to reach thereabove.

The N channel type TFT is then covered with a third resist mask 615, and impurities are added for the third time through the insulating film 105 to form heavily doped regions (P regions) 617. (FIG. 8D) In this embodiment, boron elements are used as impurities giving P type conductivity and dose of boron is determined so that the concentration of boron ions in the P regions 617 is about 1.3 to 2 times the concentration of phosphorus ions added in the n$^+$ regions.

At the first to the third addition steps of impurities mentioned above, as in Embodiment 1, impurities are implanted through the insulating film 105, thereby causing no fear of contaminants from the air, boron in particular, being mixed in the active layer. Accordingly, the concentration of impurities in the active layer may be set under control to suppress fluctuation in the threshold.

It is relatively easy to obtain n regions, n$^+$ regions, P regions and a channel formation region of desired width through proper setting of the pattern of the first to the third resist masks above by a person who carries out the invention.

It is preferable to form the first resist mask 608 and the second resist mask 612 by the formation method of a resist mask which utilizes exposure to light from the back surface, for the method makes it possible to manufacture the LDD structure in a self-alignment manner reducing the number of masks to be produced.

Figure 8E:
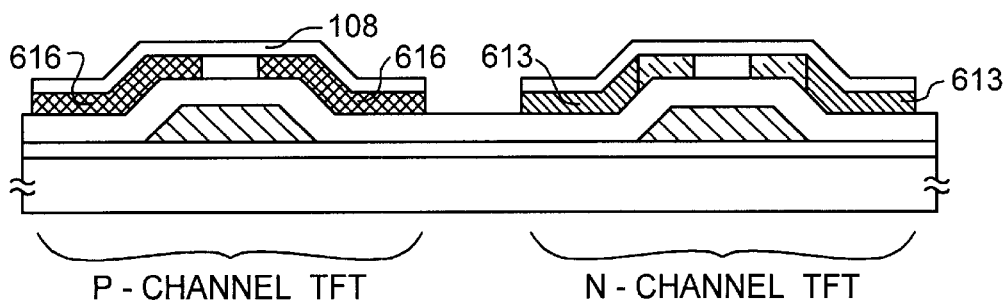

The LDD structure in which the lightly doped regions 614 overlap with a portion above the gate wiring 102 is obtained in this way, and thereafter, the first to the third resist masks are removed and the layers are patterned to have a desired shape. Regions denoted by reference numeral 616 are the P regions and region denoted by 613 are the n$^+$ regions. (FIG. 8E)

Subsequent steps follow the steps in Embodiment 1, and a semiconductor device shown in FIG. 9 is thus completed.

In FIG. 9, the structure is almost the same as that of Embodiment 1 shown in FIG. 3, other than the active layer including the channel formation region 611 and lightly doped regions 614 and 630 formed so as to overlap a portion above the gate wiring and n$^+$ regions 629 and 631, and hence description thereof is omitted.

A TFT manufactured by carrying out this embodiment exhibits electrical characteristics with less fluctuation. This embodiment may be combined with any one of Embodiments 1 through 5.

Shown in this embodiment is an example in which the resist mask 608 is formed, the heavily doped regions are then formed and thereafter, the resist mask 612 is formed to form the lightly doped regions. However, formation order of the respective impurity regions is not particularly limited. For instance, the step may be changed so that the resist mask 612 is formed, the lightly doped regions are then formed and thereafter, the resist mask 608 is formed to form the heavily doped regions. The step of forming the P regions may be placed immediately after the crystallization.

Though the active layer is patterned after formation of the impurity regions according to the example shown in this embodiment, no particular limitation is put, and for instance, the semiconductor film may be patterned immediately after the crystallization.

Embodiment 7

Figure 10A:
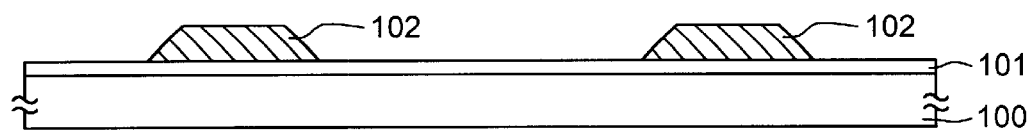
FIGS. 10A to 10C are views showing a manufacturing process of a TFT (Embodiment 7)
Figure 10B:
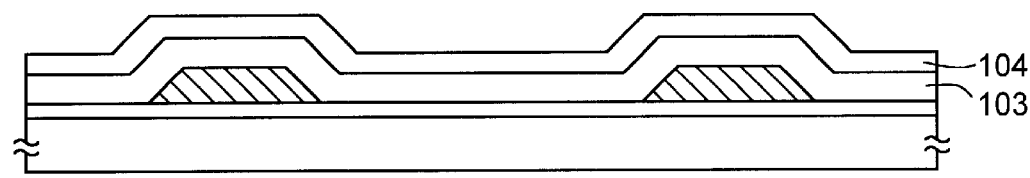
Figure 10C:
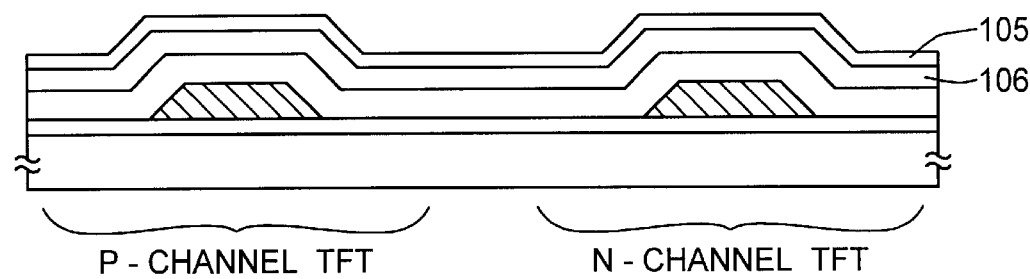

As shown in FIGS. 10A to 10C, this embodiment shows an example in which a protective film is formed by a method different from one in Embodiment 1.

The step shown in FIG. 10A corresponds to the step of FIG. 1A in Embodiment 1. This embodiment is different from Embodiment 1 in that, as shown in FIG. 10B, the gate insulating film 103 and the initial semiconductor film 104 are serially formed, and then, at the laser crystallization step under pneumatic, oxygen or oxidation atmosphere, a crystalline semiconductor film is formed and simultaneously an oxide film is formed on its surface. In the step of FIG. 10B, before forming the initial semiconductor film, contaminants on the surface where the film is formed may be reduced by active hydrogen or an active hydrogen compound.

As shown in FIG. 10C, used as the protective film is an oxide film 105 that is formed in pneumatic, oxygen or oxidation atmosphere under the following laser condition. The laser irradiation condition consists of a pulse frequency of 150 Hz, an overlap ratio of 80 to 98%, 96% in this embodiment, and laser energy density of 100 to 500 mJ/cm$^2$, preferably 280 to 380 mJ/cm$^2$, 350 mJ/cm$^2$ in this embodiment. Condition on the laser crystallization (such as wavelength of laser light, overlap ratio, irradiation intensity, pulse width, repetition frequency and irradiation time) may be properly determined by a person who carries out the invention in consideration for the film thickness of the initial semiconductor film 104 and the substrate temperature. This oxide film is preferable because it has excellent coherence to a resist as compared with a crystalline silicon film.

Subsequent steps follow the steps in Embodiment 1 to complete a semiconductor device. This embodiment may be combined with any one of Embodiments 1 through 6.

Embodiment 8

This embodiment is an example in which a semiconductor device is manufactured using an apparatus (FIG. 14) different from one in Embodiment 1.

In this embodiment, using an apparatus (apparatus shown in FIG. 14) provided with a first chamber 44 dedicated for formation of a gate insulating film and an insulating film and a second chamber 45 dedicated for formation of an initial semiconductor film, the films are formed and layered by transferring the substrate from one chamber to the other while keeping highly vacuumed state.

This embodiment tracks the same way as in Embodiment 1 up through the steps of preparing a glass substrate as the substrate 100, forming a silicon oxide nitride (expressed as SiO$_x$N$_y$) film as the base film 101 and forming the gate wiring 102. Subsequently, the three layers (gate insulating film/initial semiconductor film/insulating film) are formed and layered using the apparatus shown in FIG. 14.

First, the gate insulating film made of a silicon nitride oxide film is formed in the first chamber 44 and, thereafter, the initial semiconductor film is formed in the second chamber 45. Then, the insulating film (protective film) made of a silicon nitride oxide film thinner than the gate insulating film is formed again in the first chamber 44. In this embodiment, before forming the initial semiconductor film, contaminants on the surface where the film is formed is reduced by active hydrogen or an active hydrogen compound. Subsequent steps follow the steps in Embodiment 1 to complete a semiconductor device. In this way, to use the apparatus shown in FIG. 14 which, as compared with the apparatus shown in FIG. 13, has less chambers and requires lower apparatus installment cost improves productivity.

This embodiment may freely be combined with Embodiments 1 through 7.

Embodiment 9

This embodiment is an example in which a semiconductor device is manufactured using a mask different from one in Embodiment 1. Having almost the same basic construction as the construction in Embodiment 1, this embodiment will be described restricting to difference between them.

According to the construction of Embodiment 1, the same single mask is used when adding phosphorus elements, resulting that the elements are added also in the source region and the drain region of the P channel type TFT. However, in this embodiment, different masks are used at the step of adding of phosphorus elements and at the step of adding of boron elements, respectively. In other words, this embodiment adopts the construction in which the P channel type TFT is covered with a mask upon adding phosphorus elements. Therefore, boron does not need to be added in dose with which the concentration of boron is about 1.3 to 2 times the concentration of phosphorus ions added in the $n^+$ regions, as in Embodiment 1, and the P channel type TFT may be manufactured with good controllability.

This embodiment may freely be combined with any of Embodiments 1 through 8.

Embodiment 10

Figure 11:
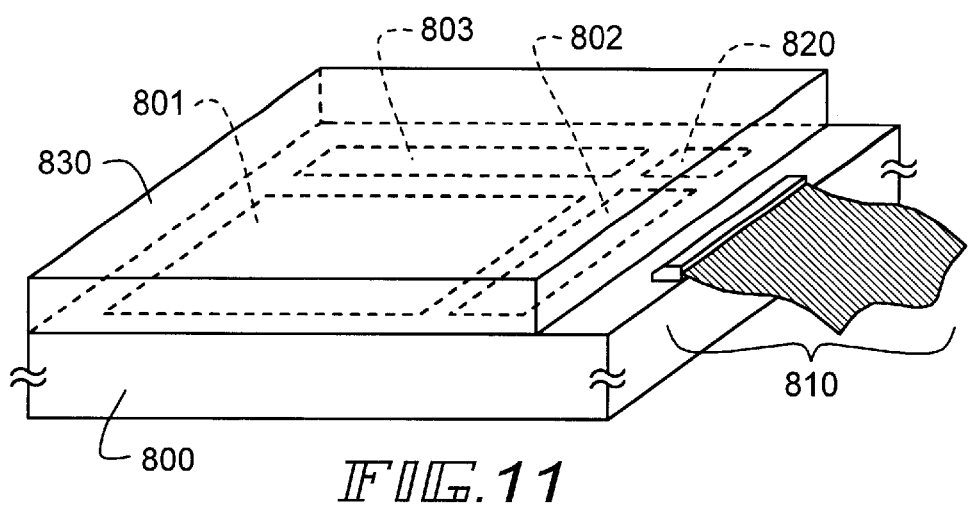
FIG. 11 is a view showing the structure of a semiconductor device (liquid crystal display device) (Embodiment 10)

This embodiment takes up an example of a liquid crystal display device manufactured in accordance with the present invention, which is shown in FIG. 11. As to a manufacturing method of a pixel TFT (pixel switching element) and a cell assembling process, known measures may be used and hence detailed description will be omitted.

In FIG. 11, reference numeral 800 denotes a substrate having an insulating surface (a plastic substrate provided with a silicon oxide film); 801, a pixel matrix circuit; 802, a scanning line driving circuit; 803, a signal line driving circuit; 830, an opposite substrate; 810, an FPC (flexible printed circuit); and 820, a logic circuit. Formed as the logic circuit 820 is a circuit for conducting such processing as ICs have conventionally processed in substitution, an example of which includes a D/A converter, a γ correction circuit and a signal dividing circuit. Of course, an IC chip may be provided on the substrate to execute signal processing in the IC chip.

Though description is made taking an example of a liquid crystal display device in this embodiment, it is needless to say that the present invention is also applicable to an EL (electroluminescence) display device and an EC (electrochromics) display device as long as it is an active matrix type display device.

Whether it is a transmission type or a reflection type does not matter when a liquid crystal display device is manufactured with the use of the present invention. A person who carries out the invention may freely decide which type to choose. Thus, the present invention may be applied to every active matrix type electro-optical device (semiconductor device).

Upon fabrication of the semiconductor device shown in this embodiment, any construction of Embodiments 1 through 9 may be employed and to use the embodiments in free combination is possible.

Embodiment 11

The present invention is applicable to conventional IC techniques in general. That is, it may be applied to all the semiconductor circuits that are distributed in the market at present. For instance, it may be applied to microprocessor such as an RISC processor or an ASIC processor which is integrated on one chip, to a signal processing circuit a typical example of which is a driver circuit for liquid crystal (such as a D/A converter, a γ correction circuit and a signal dividing circuit), or to a high frequency circuit for a portable device (such as a cellular phone, a PHS: personal handy phone system, and a mobile computer).

A semiconductor circuit such as a microprocessor is provided in various electronic equipments to function as a central circuit. Enumerated as a typical electronic equipment is a personal computer, a portable information terminal device and all the other household appliances. A computer for controlling vehicles (automobiles or trains) may also be given as an example. The present invention is applicable also to such a semiconductor device.

When manufacturing the semiconductor device shown in this embodiment, any construction of Embodiments 1 through 9 may be employed and to use the embodiments in free combination is possible.

Embodiment 12

A CMOS circuit and a pixel matrix circuit formed through carrying out the present invention may be applied to various electro-optical devices (active matrix type liquid crystal displays, active matrix type EL displays, active matrix type EC displays). Namely, the present invention may be embodied in all the electronic equipments that incorporate those electro-optical devices as display media.

As such an electronic equipment, a video camera, a digital camera, a head mount display (goggle-type display), a navigation system for vehicles, a personal computer, and a portable information terminal (a mobile computer, a cellular phone, or an electronic book) may be enumerated. Examples of those are shown in FIGS. 12A to 12F.

Figure 12A:
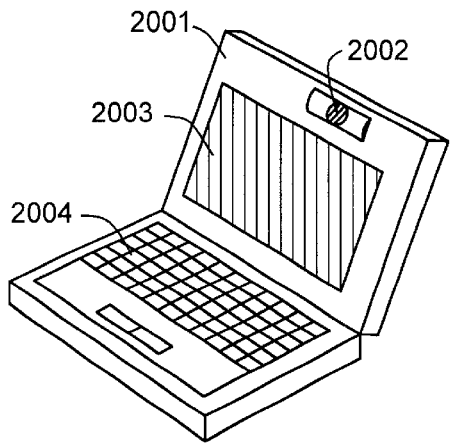
FIGS. 12A to 12F are views each showing an example of a semiconductor device (electronic equipment) (Embodiment 12)

FIG. 12A shows a personal computer comprising a main body 2001, an image inputting unit 2002, a display device 2003, and a key board 2004. The present invention is applicable to the image inputting unit 2002, the display device 2003, and other signal control circuits.

Figure 12B:
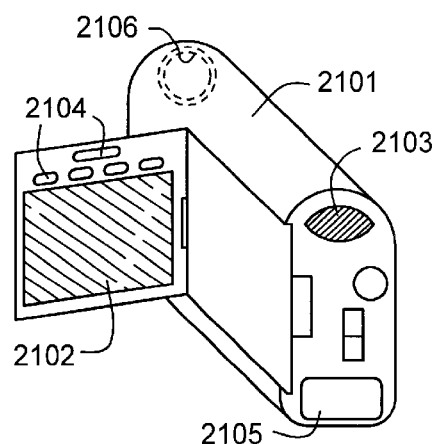

FIG. 12B shows a video camera comprising a main body 2101, a display device 2102, a voice input unit 2103, operation switches 2104, a battery 2105, and an image receiving unit 2106. The present invention is applicable to the display device 2102, the voice input unit 2103, and other signal control circuits.

Figure 12C:
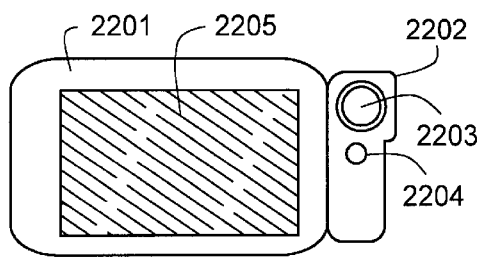

FIG. 12C shows a mobile computer comprising a main body 2201, a camera unit 2202, an image receiving unit 2203, an operation switch 2204, and a display device 2205. The present invention is applicable to the display device 2205 and other signal control circuits.

Figure 12D:
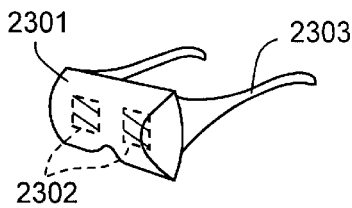

FIG. 12D shows a goggle-type display comprising a main body 2301, a display device 2302 and arm portions 2303. The present invention is applicable to the display device 2302 and other signal control circuits.

Figure 12E:
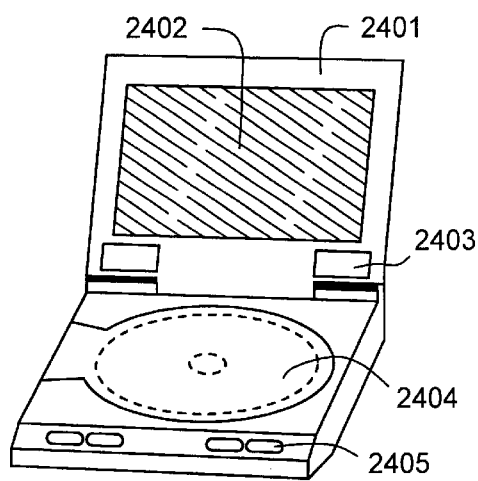

FIG. 12E shows a player that employs a recoding medium in which programs are recorded (hereinafter referred to as recording medium), and comprises a main body 2401, a display device 2402, a speaker unit 2403, a recording medium 2404, and an operation switch 2405. Incidentally, this player uses as the recoding medium a DVD (digital versatile disc), a CD and the like to serve as a tool for enjoying music or movies, for playing video games and for connecting to the Internet. The present invention is applicable to the display device 2402 and other signal control circuits.

Figure 12F:
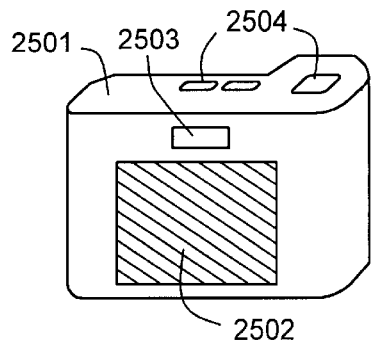

FIG. 12F shows a digital camera comprising a main body 2501, a display device 2502, an eye piece section 2503, operation switches 2504, and an image receiving unit (not shown). The present invention is applicable to the display device 2502 and other signal control circuits.

As described above, the present invention has so wide application range that it is applicable to electronic equipments in any field. In addition, the electronic equipment of this embodiment may be realized with any construction obtained by combining Embodiments 1 through 10.

Embodiment 13

In the liquid crystal display devices manufactured in accordance with Embodiment 10 described above, various kinds of liquid crystal may be used other than TN liquid crystal. For example, usable liquid crystal includes ones disclosed in: 1998, SID, "Characteristics and Driving Scheme of Polymer-Stabilized Monostable FLCD Exhibiting Fast Response Time and High Contrast Ratio with Gray-Scale Capability" by H. Furue et al.; 1997, SID DIGEST, 841, "A Full-Color Thresholdless Antiferroelectric LCD Exhibiting Wide Viewing Angle with Fast Response Time" by T. Yoshida et al.; 1996, J. Mater. Chem. 6(4), 671–673, "Thresholdless Antiferroelectricity in Liquid Crystals and its Application to Displays" by S. Inui et al.; and U.S. Pat. No. 5,594,569.

Liquid crystal that exhibits antiferroelectric phase in a certain temperature range is called antiferroelectric liquid crystal. Among mixed liquid crystal having antiferroelectric liquid crystal, there is one called thresholdless-antiferroelectric mixed liquid crystal, which exhibits electro-optical response characteristics that the transmittance varies continuously with respect to the electric field. Some of the thresholdless-antiferroelectric mixed liquid crystal show electro-optical response characteristics of V shape, and there has been found among them ones the driving voltage of which is about ±2.5 V (cell thickness of about 1 $\mu$m to 2 $\mu$m).

Figure 17:
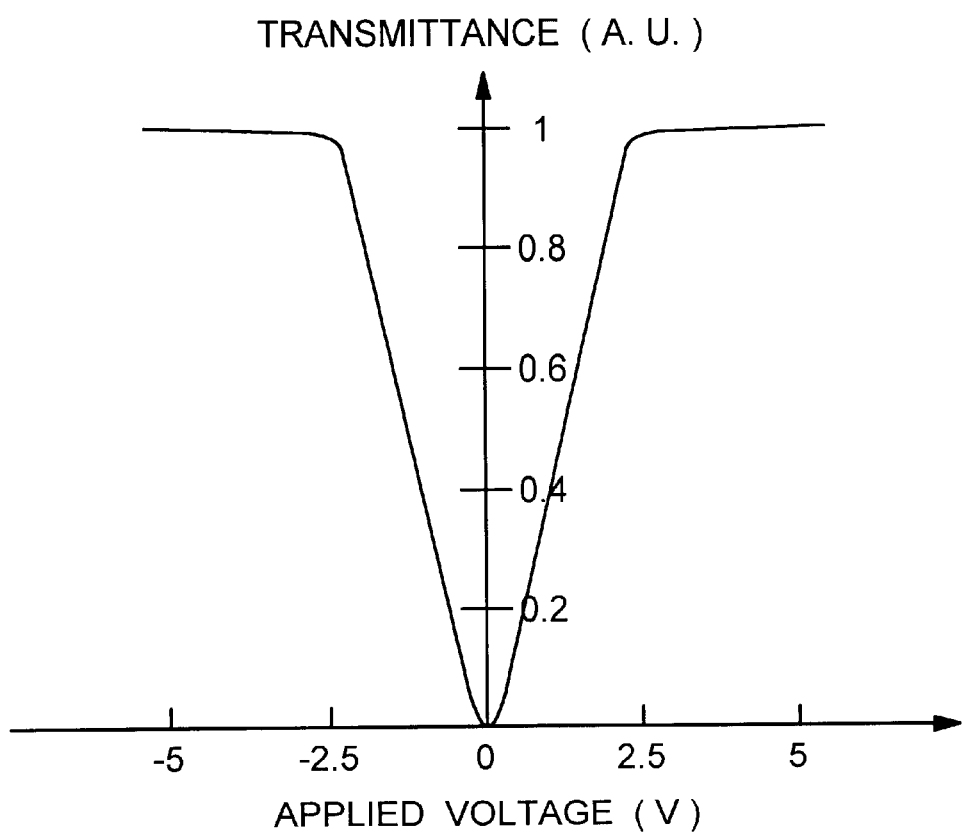
FIG. 17 is a graph showing characteristics in electro-optical response of thresholdless antiferroelectric liquid crystal (Embodiment 13).

Now, reference is made to FIG. 17 showing characteristics of the thresholdless-antiferroelectric mixed liquid crystal that exhibits electro-optical response characteristics of V shape, in terms of its light transmittance with respect to the applied voltage. In the graph shown in FIG. 17, the axis of the ordinate indicates transmittance (arbitrary unit) and the axis of abscissa indicates applied voltage. A transmission axis of a polarizing plate on the incident side of a liquid crystal display device is set almost in parallel with the normal line direction of a smectic layer of the thresholdless-antiferroelectric mixed liquid crystal which substantially coincides with the rubbing direction of the liquid crystal display device. On the other hand, a transmission axis of the polarizing plate on the emission side is set to be substantially perpendicular to the transmission axis of the polarizing plate on the incident side (cross Nicol).

As shown in FIG. 17, it can be understood that using such thresholdless-antiferroelectric mixed liquid crystal makes possible the low-voltage driving and gradation display.

In the case that such thresholdless-antiferroelectric mixed liquid crystal of low-voltage driving is used in a liquid crystal display device having an analog driver, supply voltage of a sampling circuit for a video signal may be suppressed to, for example, about 5V to 8V. Accordingly, operation supply voltage of the driver may be lowered to realize a liquid crystal display device of lowered power consumption and high reliability.

Also in the case that such thresholdless-antiferroelectric mixed liquid crystal of low-voltage driving is used in a liquid crystal display device having a digital driver, output voltage of a D/A converter circuit may be reduced so as to lower operation supply voltage of the D/A converter circuit and to lower operation supply voltage of the driver. Accordingly, a liquid crystal display device of lowered power consumption and high reliability may be realized.

Therefore, the use of such thresholdless-antiferroelectric mixed liquid crystal of low-voltage driving is effective also when employing a TFT having an LDD region (lightly doped region) of which width is relatively small (for example, 0 nm to 500 nm, or 0 nm to 200 nm).

In general, thresholdless-antiferroelectric mixed liquid crystal is large in spontaneous polarization and dielectric permittivity of liquid crystal itself is high. For that reason, relatively large holding capacitance is required for a pixel when using for a liquid crystal display device the thresholdless-antiferroelectric mixed liquid crystal. Thus, preferably used is thresholdless-antiferroelectric mixed liquid crystal that is small in spontaneous polarization. Alternatively, with employment of the linear-sequential driving as a driving method of the liquid crystal display device, writing period of gradation voltage into a pixel (pixel feed period) is prolonged so that a small holding capacitance may be supplemented.

The use of such thresholdless-antiferroelectric mixed liquid crystal realizes the low-voltage driving, to thereby realize a liquid crystal display device of lowered power consumption.

Incidentally, any liquid crystal may be used as a display medium for a liquid crystal display device of the present invention, on condition that it has electro-optical characteristics as shown in FIG. 17.

Embodiment 14

A CMOS circuit and a pixel matrix circuit formed through carrying out the present invention may be applied to various electro-optical devices (such as active matrix type liquid crystal display devices). Namely, the present invention may be embodied in all the electronic equipments that incorporate those electro-optical devices as display media.

Enumerated as such an electronic apparatus is a projector (rear-type projector or front-type projector). Examples of those are shown in FIGS. 16A to 16D.

Figure 16A:
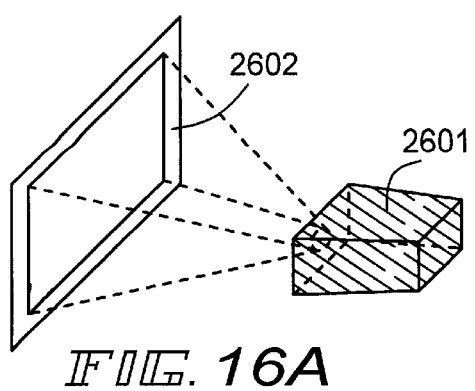
FIGS. 16A to 16D are views each showing an example of a semiconductor device (electronic equipment) (Embodiment 14)

FIG. 16A shows a front-type projector comprising a display device 2601 and a screen 2602. The present invention is applicable to the display device and other signal control circuits.

Figure 16B:
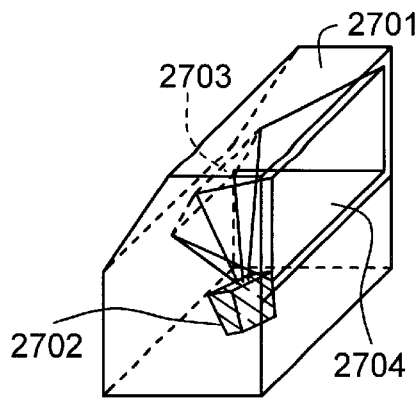

FIG. 16B shows a rear-type projector comprising a main body 2701, a display device 2702, a mirror 2703, and a screen 2704. The present invention is applicable to the display device and other signal control circuits.

Figure 16C:
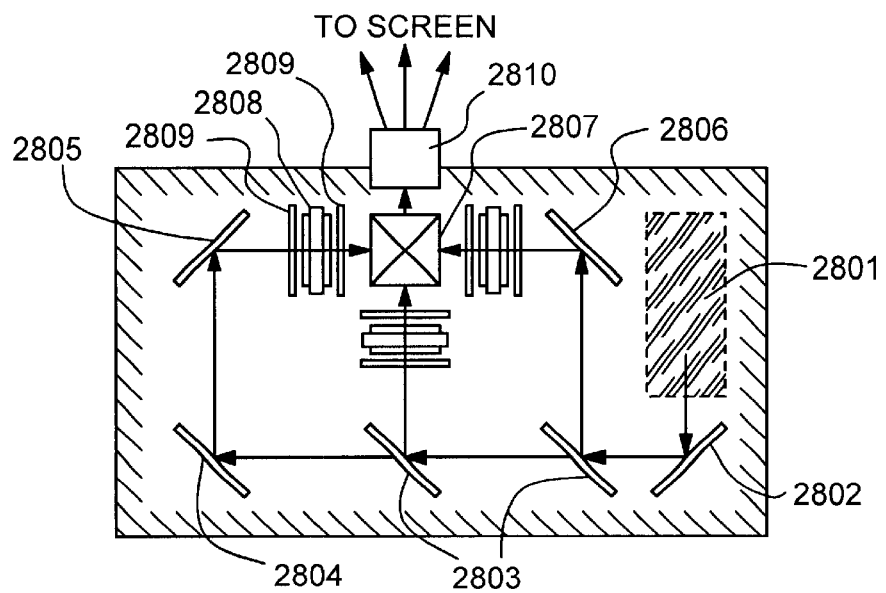

FIG. 16C is a diagram showing an example of the structure of the display devices 2601 and 2702 in FIGS. 16A and 16B. The display device 2601 or 2702 comprises a light source optical system 2801, mirrors 2802 and 2804 to 2806, dichroic mirrors 2803, a prism 2807, liquid crystal display devices 2808, phase difference plates 2809, and a projection optical system 2810. The projection optical system 2810 consists of an optical system including a projection lens. This embodiment shows an example of "three plate type", but not particularly limited thereto. For instance, the invention may be applied also to "single plate type". Further, in the light path indicated by an arrow in FIG. 16C, an optical system such as an optical lens, a film having a polarization function, a film for adjusting a phase difference and an IR film may be provided on discretion of a person who carries out the invention.

Figure 16D:
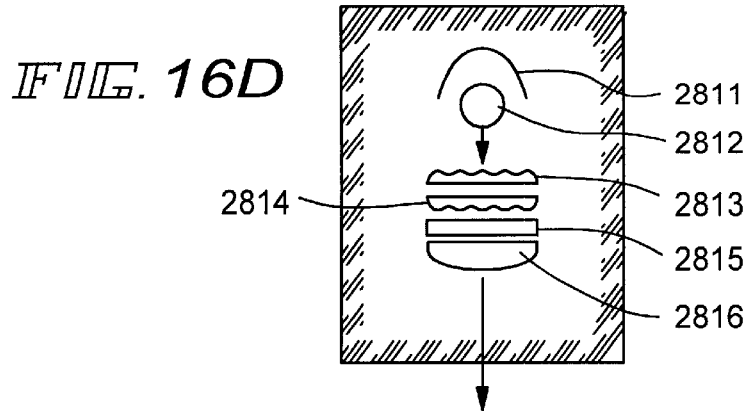

FIG. 16D is a diagram showing an example of the structure of the light source optical system 2801 in FIG. 16C. In this embodiment, the light source optical system 2801 comprises a reflector 2811, light sources 2812, lens arrays 2813 and 2814, a polarization conversion element 2815, and a condenser lens 2816. The light source optical system shown in FIG. 16D is an example thereof, and is not particularly limited. For instance, on discretion of a person who carries out the invention, the light source optical system may be provided with an optical system such as an optical lens, a film having a polarization function, a film for adjusting the phase difference and an IR film.

As described above, the present invention has so wide application range that it is applicable to electronic equipments in any field. In addition, the electronic equipments of this embodiment may be realized with any construction obtained by combining Embodiments 1 through 10 and 13.

Figure 14:
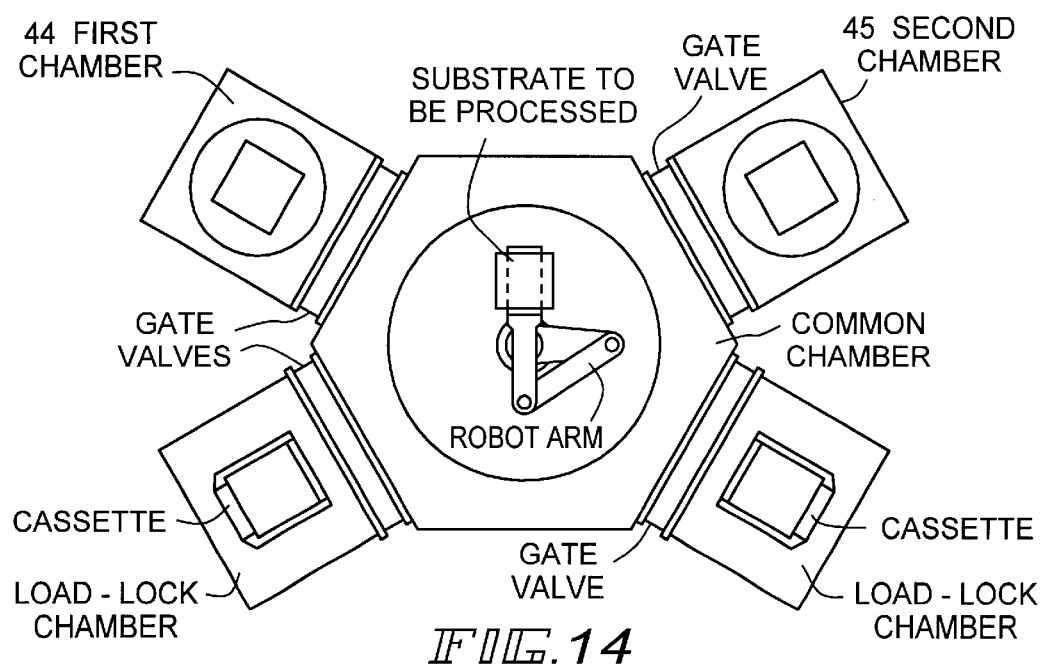
FIG. 14 is a view showing an example of a film formation apparatus (Embodiment 8)

Through carrying out the present invention with the use of an apparatus shown in FIG. 13 or FIG. 14, the process is completed without exposing to the air the interface (on the main surface side and on the back surface side) of the active layer in the TFT, thereby realizing very extremely interface.

Such a construction may keep cleanness at the interface between the active layer and the gate insulating film which particularly influences electrical characteristics of the TFT, and may realize a TFT that has less fluctuation and exhibits good electrical characteristics.

Figure 15:
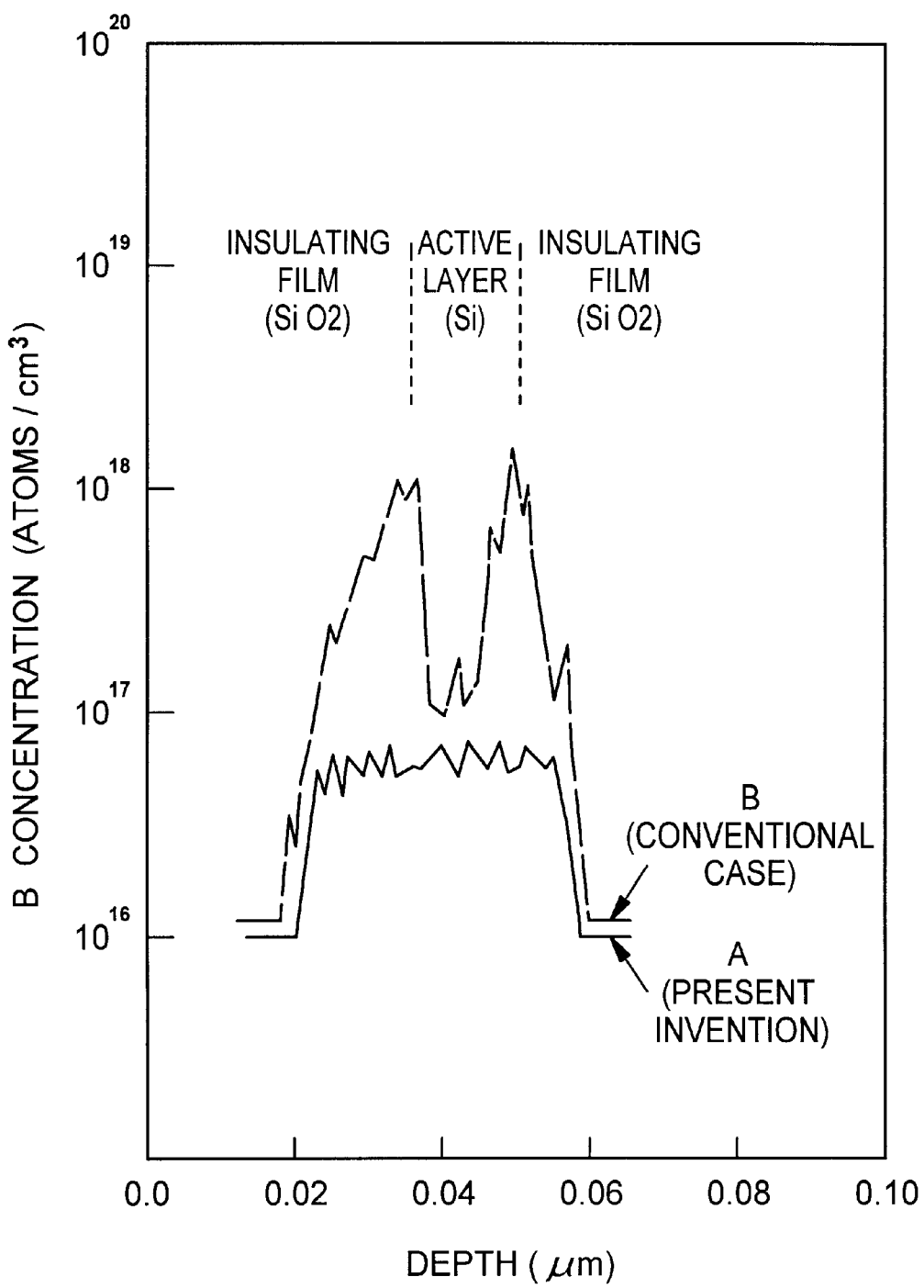
FIG. 15 is a graph showing profiles of the B concentration obtained by the SIMS analyzation (a comparative example of the present invention with a conventional case)

Also, the protective film prevents contaminants contained in the air, boron in particular, from being mixed in, and impurities giving conductivity are added through this protective film, so that accurate control of threshold may be realized. Conventionally, SIMS analyzation shows that the concentration of boron peaks (the concentration peak is shown in FIG. 15 by the dotted line B) at the interface (on the main surface side and on the back surface side) of the active layer (channel formation region) of a TFT, and that the peak value thereof is $1 \times 10^{18}$ atoms/cm$^3$ or more. In contrast, the interface (on the main surface side and on the back surface side) of the active layer (channel formation region) of the TFT manufactured utilizing the present invention does not have the concentration peak of boron but shows a substantially even concentration profile (indicated by the dotted line A in FIG. 15), thereby realizing to hold down the maximum value in the concentration of boron to $3 \times 10^{17}$ atoms/cm$^3$ or less, preferably $1 \times 10^{17}$ atoms/cm$^3$ or less. Also, in the active layer (channel formation region), the concentration of oxygen may be held down to $2 \times 10^{19}$ atoms/cm$^3$ or less; carbon to $5 \times 10^{18}$ atoms/cm$^3$ or less; and nitrogen to $5 \times 10^{18}$ atoms/cm$^3$ or less. The concentration of sodium in the active layer (channel formation region) may be held down to $3 \times 10^{16}$ atoms/cm$^3$ or less.

In such a TFT, the threshold voltage, that is a typical parameter of a TFT, of −0.5 to 2 V in an N channel type TFT and of 0.5 to −2 V in a P channel type TFT may be realized. Also may be attained is a subthreshold coefficient (S value) of 0.1 to 0.3 V/decade.

As shown in the embodiments above, there may be obtained a TFT provided with an LDD structure with high productivity, which is high in reproducibility and capable of improving stability of the TFT. The present invention uses a resist mask formed by irradiation with light from the back surface, which makes it possible to manufacture the TFT in a short period of time.

What is claimed is:

1. A method of manufacturing a semiconductor device provided with a semiconductor circuit comprising a semiconductor element, comprising:

forming a gate wiring over a substrate;

sequentially forming a gate insulating film, a semiconductor film and a second insulating film over said gate wiring and the substrate without exposing to the air;

crystallizing said semiconductor film by irradiating the semiconductor film through said second insulating film with light to obtain a crystalline semiconductor film;

patterning said crystalline semiconductor film and said second insulating film to form a protective film and an active layer an end face of which is flush with an end face of said protective film; and covering with a mask a region to be a channel formation region of said active layer, and adding through said protective film impurity elements that give N type or P type conductivity.

2. A method of manufacturing a semiconductor device provided with a semiconductor circuit comprising a semiconductor element of claim 1, wherein said light is infrared light or ultraviolet light.

3. A method of manufacturing a semiconductor device provided with a semiconductor circuit comprising a semiconductor element of claim 2, wherein said infrared light is an infrared laser light.

4. A method of manufacturing a semiconductor device provided with a semiconductor circuit comprising a semiconductor element of claim 2, wherein said infrared light is an infrared lamp.

5. A method of manufacturing a semiconductor device provided with a semiconductor circuit comprising a semiconductor element of claim 2, wherein said ultraviolet light is an excimer laser light.

6. A method of manufacturing a semiconductor device provided with a semiconductor circuit comprising a semiconductor element of claim 2, wherein said ultraviolet light is an ultraviolet lamp.

7. A method of manufacturing a semiconductor device provided with a semiconductor circuit comprising a semiconductor element as claimed in claim 1, wherein said gate insulating film, said initial semiconductor film and said protective film are formed respectively using chambers different from one another.

8. A method of manufacturing a semiconductor device provided with a semiconductor circuit comprising a semiconductor element as claimed in claim 1, wherein said gate insulating film and said protective film are formed using a first chamber, and said initial semiconductor film is formed using a second chamber.

9. A method of manufacturing a semiconductor device provided with a semiconductor circuit comprising a semiconductor element as claimed in claim 1, wherein said method further comprises a step of forming as said gate insulating film a laminated film including, among other layers, one layer of a silicon nitride film.

10. A method of manufacturing a semiconductor device provided with a semiconductor circuit comprising a semiconductor element as claimed in claim 1, wherein said method further comprises a step of forming as said gate insulating film a laminated film including, among other layers, one layer of a BCB (benzocyclobutene) film.

11. A method of manufacturing a semiconductor device provided with a semiconductor circuit comprising a semiconductor element as claimed in claim 1, wherein said semiconductor device is an electro-optical device or an electronic equipment.

12. A method of manufacturing a semiconductor device provided with a semiconductor circuit comprising a semiconductor element of claim 11, wherein said electro-optical device is a liquid crystal display device, an EL display device, an EC display device or an image sensor.

13. A method of manufacturing a semiconductor device provided with a semiconductor circuit comprising a semiconductor element, comprising:

forming a gate wiring over a substrate;

sequentially forming a gate insulating film, a semiconductor film and a second insulating film over said gate wiring and the substrate without exposing to the air;

crystallizing said semiconductor film by irradiating the semiconductor film through said second insulating film with infrared light or ultraviolet light to obtain a crystalline semiconductor film;

covering with a mask a region to be a channel formation region of said crystalline semiconductor film, and adding through said second insulating film impurity elements that give N type or P type conductivity;

patterning said second insulating film to form a protective film; and patterning said crystalline semiconductor film to form an active layer an end face of which is flush with an end face of said protective film.

14. A method of manufacturing a semiconductor device provided with a semiconductor circuit comprising a semiconductor element as claimed in claim 13, wherein said gate insulating film, said initial semiconductor film and said protective film are formed respectively using chambers different from one another.

15. A method of manufacturing a semiconductor device provided with a semiconductor circuit comprising a semiconductor element as claimed in claim 13, wherein said gate insulating film, and said protective film are formed using a first chamber, and said initial semiconductor film is formed using a second chamber.

16. A method of manufacturing a semiconductor device provided with a semiconductor circuit comprising a semiconductor element as claimed in claim 13, wherein said method comprises a step of forming as said gate insulating film a laminated film including, among other layers, one layer of a silicon nitride film.

17. A method of manufacturing a semiconductor device provided with a semiconductor circuit comprising a semiconductor element as claimed in claim 13, wherein said method further comprises a step of forming as said gate insulating film a laminated film including, among other layers, one layer of a BAB (benzocyclobutene) film.

18. A method of manufacturing a semiconductor device provided with a semiconductor circuit comprising a semiconductor element as claimed in claim 13, wherein said semiconductor is an electro-optical device or an electronic equipment.

19. A method of manufacturing a semiconductor device provided with a semiconductor circuit comprising a semiconductor element as claimed in claim 18, wherein said electro-optical device is a liquid crystal display device, an EL display device, an EC display device or an image sensor.

20. A method of manufacturing a semiconductor device provided with a semiconductor circuit comprising a semiconductor element, comprising:

forming a gate wiring over a substrate;

sequentially forming a gate insulating film, a semiconductor film and a second insulating film over said gate wiring and the substrate without exposing to the air;

crystallizing said semiconductor film by irradiating the semiconductor film through said second insulating film with infrared light or ultraviolet light to obtain a crystalline semiconductor film;

patterning said crystalline semiconductor film and said insulating film to form a protective film and an active layer an end face of which is flush with an end face of said protective film;

covering with a first mask a region to be a channel formation region of said active layer, and adding through said protective film impurity elements that give N type or P type conductivity; and adding with the use of a second mask impurity elements that give N type or P type conductivity in a region to be a source region or a drain region of said active layer.

21. A method of manufacturing a semiconductor device provided with a semiconductor circuit comprising a semiconductor element as claimed in claim 20, wherein said first mask is a resist mask formed by irradiating the back surface of said substrate with light.

22. A method of manufacturing a semiconductor device provided with a semiconductor circuit comprising a semiconductor element as claimed in claim 20, wherein said gate insulating film, said initial semiconductor film and said protective film are formed respectively using chambers different from one another.

23. A method of manufacturing a semiconductor device provided with a semiconductor circuit comprising a semiconductor element as claimed in claim 20, wherein said gate insulating film, and said protective film are formed using a first chamber, and said initial semiconductor film is formed using a second chamber.

24. A method of manufacturing a semiconductor device provided with a semiconductor circuit comprising a semiconductor element as claimed in claim 20, wherein said method comprises a step of forming as said gate insulating film a laminated film including, among other layers, one layer of a silicon nitride film.

25. A method of manufacturing a semiconductor device provided with a semiconductor circuit comprising a semiconductor element as claimed in claim 20, wherein said method further comprises a step of forming as said gate insulating film a laminated film including, among other layers, one layer of a BAB (benzocyclobutene) film.

26. A method of manufacturing a semiconductor device provided with a semiconductor circuit comprising a semiconductor element as claimed in claim 20, wherein said semiconductor is an electro-optical device or an electronic equipment.

27. A method of manufacturing a semiconductor device provided with a semiconductor circuit comprising a semiconductor element as claimed in claim 26, wherein said electro-optical device is a liquid crystal display device, an EL display device, an EC display device or an image sensor.

28. A method of manufacturing a semiconductor device provided with a semiconductor circuit comprising a semiconductor element, comprising:

forming a gate wiring over a substrate;

sequentially forming a gate insulating film, a semiconductor film and a second insulating film over said gate wiring and the substrate without exposing to the air;

crystallizing said semiconductor film by irradiating the semiconductor film through said second insulating film with infrared light or ultraviolet light to obtain a crystalline semiconductor film;

patterning said crystalline semiconductor film and said second insulating film to form a protective film and an active layer an end face of which is flush with an end face of said protective film;

covering with a first mask a region to be a channel formation region of said active layer, and adding through said protective film impurity elements that give N type or P type conductivity;

adding with the use of a second mask impurity elements that give N type or P type conductivity in a region to be a source region or a drain region of said active layer; and removing said first mask and said second mask at once.

29. A method of manufacturing a semiconductor device provided with a semiconductor circuit comprising a semiconductor element as claimed in claim 28, wherein said first mask is a resist mask formed by irradiating the back surface of said substrate with light.

30. A method of manufacturing a semiconductor device provided with a semiconductor circuit comprising a semiconductor element as claimed in claim 28, wherein said gate insulating film, said initial semiconductor film and said protective film are formed respectively using chambers different from one another.

31. A method of manufacturing a semiconductor device provided with a semiconductor circuit comprising a semiconductor element as claimed in claim 28, wherein said gate insulating film, and said protective film are formed using a first chamber, and said initial semiconductor film is formed using a second chamber.

32. A method of manufacturing a semiconductor device provided with a semiconductor circuit comprising a semiconductor element as claimed in claim 28, wherein said method comprises a step of forming as said gate insulating film a laminated film including, among other layers, one layer of a silicon nitride film.

33. A method of manufacturing a semiconductor device provided with a semiconductor circuit comprising a semiconductor element as claimed in claim 28, wherein said method further comprises a step of forming as said gate insulating film a laminated film including, among other layers, one layer of a BAB (benzocyclobutene) film.

34. A method of manufacturing a semiconductor device provided with a semiconductor circuit comprising a semiconductor element as claimed in claim 28, wherein said semiconductor is an electro-optical device or an electronic equipment.

35. A method of manufacturing a semiconductor device provided with a semiconductor circuit comprising a semiconductor element as claimed in claim 34, wherein said electro-optical device is a liquid crystal display device, an EL display device, an EC display device or an image sensor.

36. A method of manufacturing a semiconductor device provided with a semiconductor circuit comprising a semiconductor element, comprising:

forming a gate wiring over a substrate;

sequentially forming a gate insulating film, a semiconductor film and a second insulating film over said gate wiring and the substrate without exposing to the air;

crystallizing said semiconductor film by irradiating the semiconductor film through said insulating film with infrared light or ultraviolet light to obtain a crystalline semiconductor film;

covering with a first mask a region to be a channel formation region of said crystalline semiconductor film, and adding through said insulating film impurity elements that give N type or P type conductivity;

adding with the use of a second mask impurity elements that give N type or P type conductivity in a region to be a source region or a drain region of said crystalline semiconductor film;

patterning said insulating film to form a protective film; and patterning said crystalline semiconductor film to form an active layer an end face of which is flush with an end face of said protective film.

37. A method of manufacturing a semiconductor device provided with a semiconductor circuit comprising a semiconductor element as claimed in claim 36, wherein said first mask is a resist mask formed by irradiating the back surface of said substrate with light.

38. A method of manufacturing a semiconductor device provided with a semiconductor circuit comprising a semiconductor element as claimed in claim 36, wherein said gate insulating film, said initial semiconductor film and said protective film are formed respectively using chambers different from one another.

39. A method of manufacturing a semiconductor device provided with a semiconductor circuit comprising a semiconductor element as claimed in claim 36, wherein said gate insulating film, and said protective film are formed using a first chamber, and said initial semiconductor film is formed using a second chamber.

40. A method of manufacturing a semiconductor device provided with a semiconductor circuit comprising a semiconductor element as claimed in claim 36, wherein said method comprises a step of forming as said gate insulating film a laminated film including, among other layers, one layer of a silicon nitride film.

41. A method of manufacturing a semiconductor device provided with a semiconductor circuit comprising a semiconductor element as claimed in claim 36, wherein said method further comprises a step of forming as said gate insulating film a laminated film including, among other layers, one layer of a BAB (benzocyclobutene) film.

42. A method of manufacturing a semiconductor device provided with a semiconductor circuit comprising a semiconductor element as claimed in claim 36, wherein said semiconductor is an electro-optical device or an electronic equipment.

43. A method of manufacturing a semiconductor device provided with a semiconductor circuit comprising a semiconductor element as claimed in claim 42, wherein said electro-optical device is a liquid crystal display device, an EL display device, an EC display device or an image sensor.

44. A method of manufacturing a semiconductor device provided with a semiconductor circuit comprising a semiconductor element, comprising:

forming a gate wiring over a substrate;

sequentially forming a gate insulating film, a semiconductor film and a second insulating film over said gate wiring and the substrate without exposing to the air;

crystallizing said semiconductor film by irradiating the semiconductor film through said second insulating film with infrared light or ultraviolet light to obtain a crystalline semiconductor film;

covering with a first mask a region to be a channel formation region of said crystalline semiconductor film, and adding through said second insulating film impurity elements that give N type or P type conductivity;

adding with the use of a second mask impurity elements that give N type or P type conductivity in a region to be a source region or a drain region of said crystalline semiconductor film;

removing said first mask and said second mask at once;

patterning said second insulating film to form a protective film; and patterning said crystalline semiconductor film to form an active layer an end face of which is flush with an end face of said protective film.

45. A method of manufacturing a semiconductor device provided with a semiconductor circuit comprising a semiconductor element as claimed in claim 44, wherein said first mask is a resist mask formed by irradiating the back surface of said substrate with light.

46. A method of manufacturing a semiconductor device provided with a semiconductor circuit comprising a semiconductor element as claimed in claim 44, wherein said gate insulating film, said initial semiconductor film and said protective film are formed respectively using chambers different from one another.

47. A method of manufacturing a semiconductor device provided with a semiconductor circuit comprising a semiconductor element as claimed in claim 44, wherein said gate insulating film, and said protective film are formed using a first chamber, and said initial semiconductor film is formed using a second chamber.

48. A method of manufacturing a semiconductor device provided with a semiconductor circuit comprising a semiconductor element as claimed in claim 44, wherein said method comprises a step of forming as said gate insulating film a laminated film including, among other layers, one layer of a silicon nitride film.

49. A method of manufacturing a semiconductor device provided with a semiconductor circuit comprising a semiconductor element as claimed in claim 44, wherein said method further comprises a step of forming as said gate insulating film a laminated film including, among other layers, one layer of a BAB (benzocyclobutene) film.

50. A method of manufacturing a semiconductor device provided with a semiconductor circuit comprising a semiconductor element as claimed in claim 44, wherein said semiconductor is an electro-optical device or an electronic equipment.

51. A method of manufacturing a semiconductor device provided with a semiconductor circuit comprising a semiconductor element as claimed in claim 50, wherein said electro-optical device is a liquid crystal display device, an EL display device, an EC display device or an image sensor.

* * * * *